(12) United States Patent
Chew et al.

(10) Patent No.: US 11,832,377 B2
(45) Date of Patent: Nov. 28, 2023

(54) INDUSTRIAL CONTROL DEVICE AND METHOD FOR INSERTION AND REMOVAL OF A MODULE UNDER POWER WITHOUT INTERRUPTION

(71) Applicant: Rockwell Automation Asia Pacific Business Center Pte. Ltd., Singapore (SG)

(72) Inventors: Earn Kong Chew, Singapore (SG); Yedi Supriadi, Singapore (SG)

(73) Assignee: Rockwell Automation Asia Pacific Business Center Pte. Ltd., Singapore (SG)

( * ) Notice: Subject to any disclaimer, the term of this patent is extended or adjusted under 35 U.S.C. 154(b) by 120 days.

(21) Appl. No.: 17/481,471

(22) Filed: Sep. 22, 2021

(65) Prior Publication Data

US 2023/0102439 A1 Mar. 30, 2023

(51) Int. Cl.
| | |
|---|---|
| H05K 7/14 | (2006.01) |
| H05K 5/00 | (2006.01) |
| H05K 1/11 | (2006.01) |
| G06F 13/00 | (2006.01) |

(52) U.S. Cl.
CPC .......... *H05K 7/1401* (2013.01); *G06F 13/00* (2013.01); *H05K 1/117* (2013.01); *H05K 5/0065* (2013.01); *H05K 7/1418* (2013.01)

(58) Field of Classification Search
CPC .... G06F 13/00; H05K 7/1401; H05K 5/0065; H05K 7/1418; H05K 1/117
See application file for complete search history.

(56) References Cited

U.S. PATENT DOCUMENTS

| | | | |
|---|---|---|---|
| 4,658,333 A | 4/1987 | Grimes | |
| 5,028,809 A | 7/1991 | Watanabe et al. | |
| 5,455,911 A | 10/1995 | Johansson | |
| 5,716,241 A | 2/1998 | Hennemann et al. | |
| 6,349,235 B1 | 2/2002 | Gibart et al. | |
| 6,639,894 B1 * | 10/2003 | Sensel .................. | H04L 1/22 370/217 |
| 7,917,675 B2 | 3/2011 | Murphy et al. | |

(Continued)

OTHER PUBLICATIONS

European Search Report for App. No. 15202950.0 dated May 30, 2016, Munich, Germany, 4 pages.

(Continued)

*Primary Examiner* — Henry Tsai
*Assistant Examiner* — Christopher A Daley
(74) *Attorney, Agent, or Firm* — Lippes Mathias LLP

(57) ABSTRACT

Disclosed is an industrial control device including a point-to-point backplane/point module architecture providing RIUP (Removal and Insertion Under Power) functionality where data communications between modules is maintained after the removal of a point module from the backplane. According to an exemplary embodiment, a backplane includes a plurality of passive mechanical bypass switches controlled by the insertion and removal of respective point modules, whereby data communicated bypass a removed point module interface and point-to-point data communications are provided to an inserted point module after an initial routine is executed by a microcontroller associated with the inserted point module.

18 Claims, 31 Drawing Sheets

(56) References Cited

U.S. PATENT DOCUMENTS

| | | | |
|---|---|---|---|
| 8,129,833 B2* | 3/2012 | Kang | H01L 24/82 |
| | | | 257/E27.137 |
| 8,246,358 B2 | 8/2012 | Molnar et al. | |
| 8,264,852 B2 | 9/2012 | Nelson et al. | |
| 8,308,490 B2 | 11/2012 | Molnar et al. | |
| 8,769,158 B2 | 7/2014 | Kretschmann et al. | |
| 8,937,966 B2 | 1/2015 | Kretschmann et al. | |
| 9,774,544 B2* | 9/2017 | Kong | H04L 49/40 |
| 10,224,721 B2* | 3/2019 | Luo | H05K 7/1407 |
| 10,739,745 B1 | 8/2020 | Kretschmann | |
| 11,516,935 B2* | 11/2022 | Frye | H05K 7/1477 |
| 11,564,324 B2* | 1/2023 | Wrobel | H05K 7/1477 |
| 2012/0221155 A1 | 8/2012 | Miles et al. | |
| 2013/0120958 A1* | 5/2013 | Yu | H05K 9/0066 |
| | | | 361/818 |
| 2014/0226460 A1* | 8/2014 | Kretschmann | G06F 13/409 |
| | | | 370/419 |
| 2014/0310441 A1 | 10/2014 | Klughart | |
| 2016/0191418 A1* | 6/2016 | Kong | H04L 49/40 |
| | | | 370/400 |
| 2019/0235465 A1 | 8/2019 | Lee | |
| 2021/0234290 A1* | 7/2021 | Dunham | H01R 12/58 |

OTHER PUBLICATIONS

Extended European Search Report, EP Application No. 22196337.4, dated Apr. 26, 2023, 9 pages.

* cited by examiner

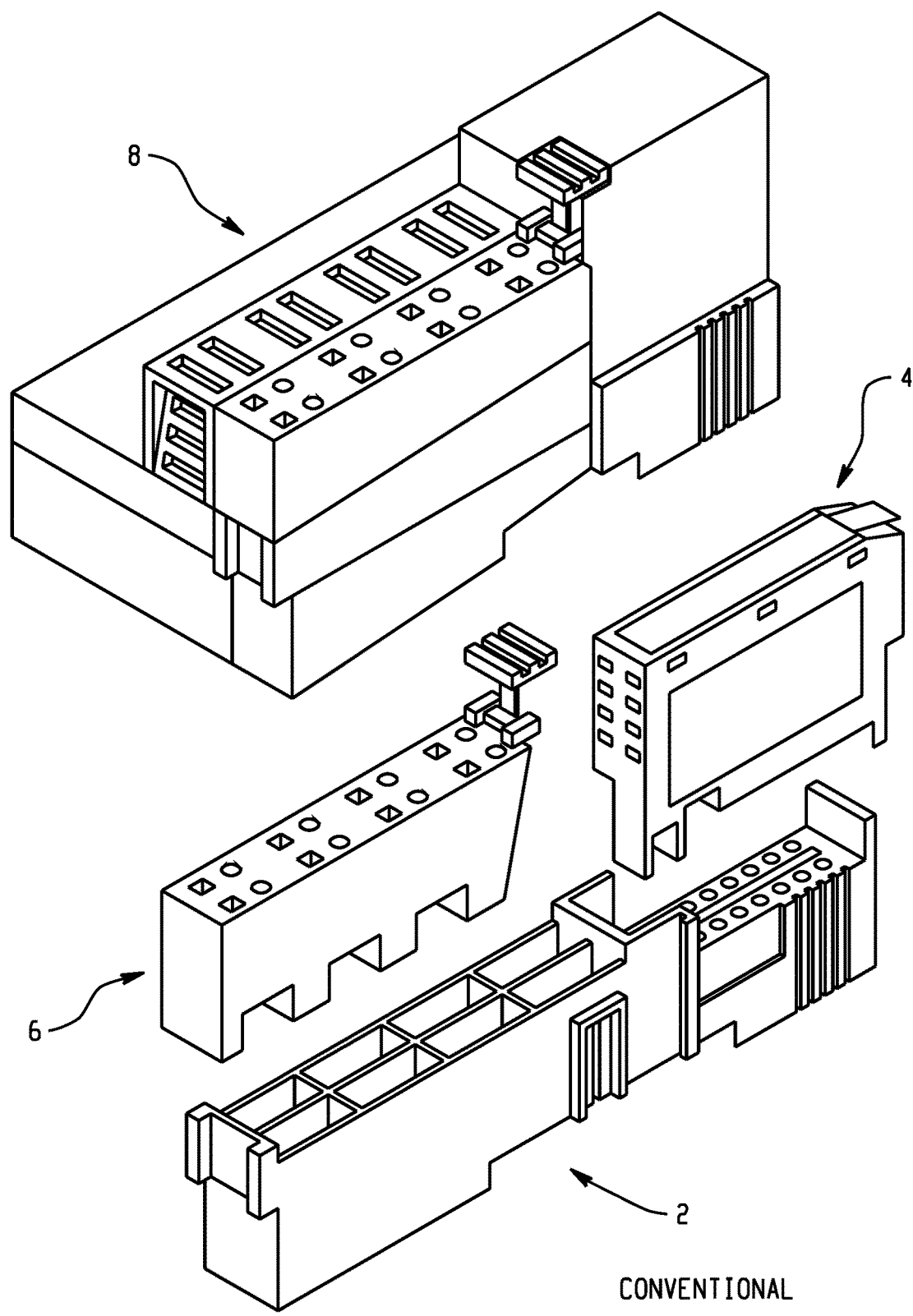
CONVENTIONAL
Fig. 1

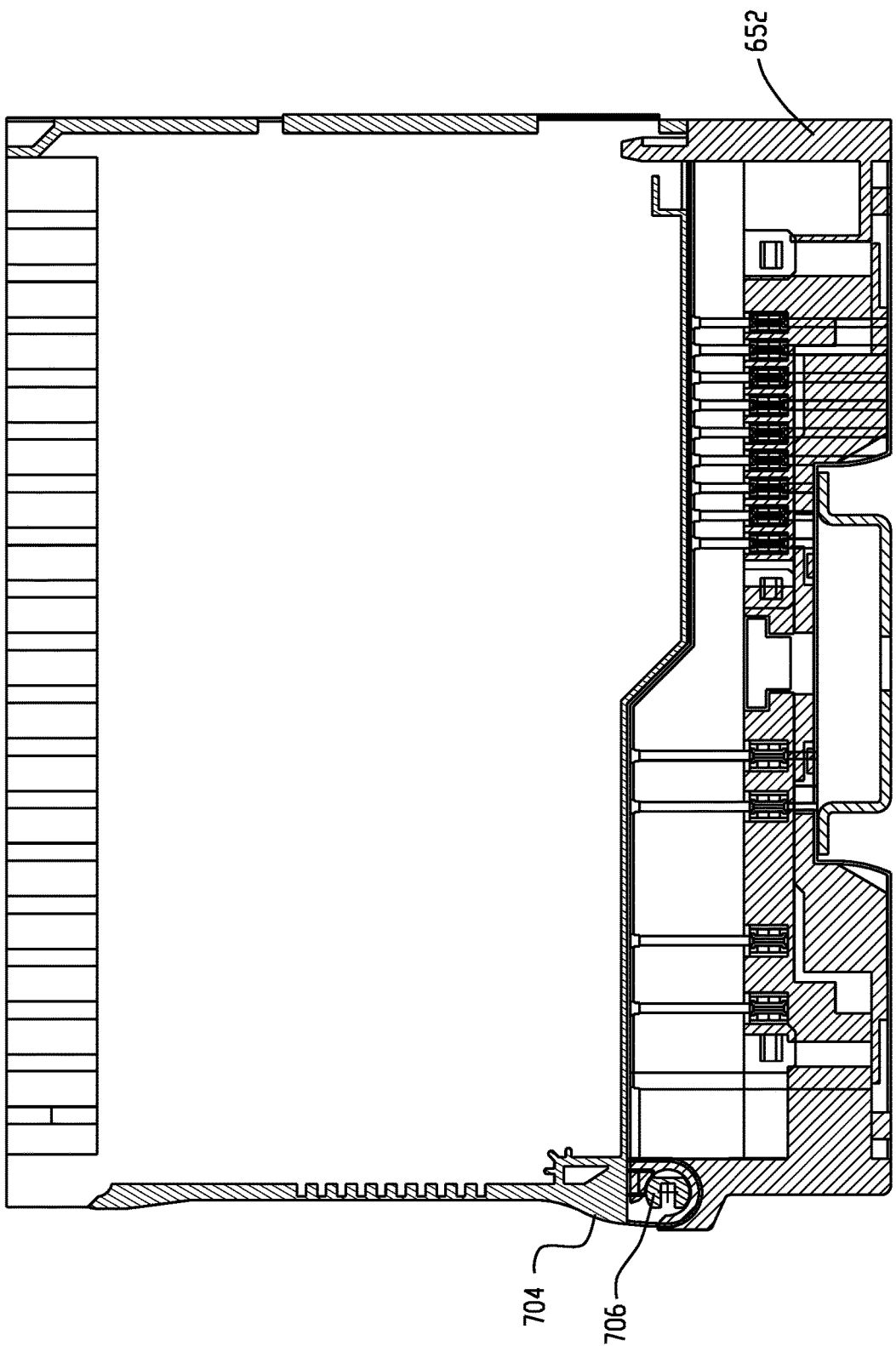

INDUSTRIAL CONTROL DEVICE AND METHOD FOR INSERTION AND REMOVAL OF A MODULE UNDER POWER WITHOUT INTERRUPTION

BACKGROUND INFORMATION

The subject matter disclosed herein relates to industrial process control systems, methods and devices. Specifically, the disclosed subject matter relates to industrial control devices which include a plurality of modules, such as, but not limited to, I/O (Input/Output) modules, where it is desired to remove and insert a module into a backplane component of the control device without interrupting, or minimally interrupting, data communications between other modules attached to the backplane.

FIG. 1 shows a conventional point module arrangement for an industrial process control device. As shown, the device includes a mounting base 2, a removable terminal block (RTB) 6, a point adaptor 8 and a point module 4. Applications of this architecture include industrial controllers, distributed I/O controllers, machine controllers, field devices, etc. Multiple point modules can be attached adjacently to provide a multi-module system, where the mounting bases incorporate an active backplane which provides power to the point modules and includes the necessary interface to provide data communications between the point modules, as well as data communications with the point adapter which communicates with an external network, other device, and/or industrial controller, etc.

With reference to FIG. 2, illustrated is a conventional point-to-point backplane module arrangement for a controller including a plurality of I/O modules 22, 24 and 26, and an Ethernet communication adapter 20. As shown, the arrangement includes a point-to-point backplane including mounting bases 28, 30 and 32 for each of the I/O modules 22, 24 and 26, respectively. Importantly, if an I/O module is disengaged, i.e., removed, from the backplane, data communications connectivity is broken between the modules adjacent to the removed module, as is shown with I/O module 24 detached from mounting base 30 in FIG. 2.

With reference to FIG. 3, illustrated is a conventional multi-point backplane module arrangement for a controller including a plurality of I/O modules 40, 42 and 44 and an Ethernet communication adapter 20. As shown, the arrangement includes a multi-point backplane including mounting bases 46, 48 and 50 for each of the I/O modules 40, 42 and 44, respectively. Importantly, if an I/O module is removed or inserted, i.e., removed from the backplane or inserted to the backplane, data communications connectivity is maintained with the downstream I/O modules because a multi-point communications protocol, e.g., CAN (Controller Area Network) (DeviceNet), is used for data communications between the I/O modules. For example, as shown in FIG. 3, I/O module 40 is removed from mounting base 46 which does not interrupt communications between point adapter 20, I/O module 42 and 44.

A point-to-point backplane arrangement, as shown in FIG. 2, typically can achieve higher data communication rates, as compared to a multi-point backplane arrangement, as shown in FIG. 3. For example, a point-to-point Ethernet based data communication network typically achieves 100 Mbps-1 Gbps, and a multi-point based data communication network typically achieves 1 Mbps for a CAN bus based network and 50 Mbps for a RS485 based network. Therefore, from a data communication speed perspective, it is desirable to use a point-to-point backplane arrangement. However, as discussed above with reference to FIG. 2, a conventional point-to-point backplane arrangement has the disadvantage of not providing RIUP (Removal and Insertion Under Power) functionality while maintaining data communications with modules downstream of a removed point module.

U.S. Pat. No. 9,774,544 issued to Kong on Sep. 26, 2017, discloses a RIUP point-to-point module arrangement with relatively minimum or no loss of data communications with downstream point modules with the removal of a point module from a backplane, the backplane including an active, powered bypass data switch arrangement.

This disclosure and the exemplary embodiments described herein provide a RIUP point-to-point module arrangement with relatively minimum or no loss of data communications with downstream point modules with the removal of a point module from a backplane, the backplane including a passive bypass data switch arrangement.

BRIEF DESCRIPTION

In one embodiment of this disclosure, described is an industrial control device comprising: a plurality of I/O (Input/Output) modules, each I/O module including a microcontroller operatively connected to a first data communication channel, a second data communication channel, a RIUP (Removable and Insertion Under Power) control signal line, and a normally closed I/O module bypass data switch operatively associated with the microcontroller, the bypass data switch including a first switch contact operatively associated with the first data communication channel and a second switch contact operatively associated with the second data communication channel, wherein the first data communication channel, the second data communication channel and the RIUP control signal line terminate on a plurality of respective printed circuit board (PCB) edge pads located near a PCB interface connection edge, and the RIUP control signal PCB edge pad is offset from the PCB interface connection edge a greater distance relative to the first data communication channel and the second data communication channel PCB edge pad offsets from the PCB interface connection edge; and a point-to-point backplane removably coupled to each of the plurality of I/O modules, for each coupled I/O module the backplane including a RIUP control signal line terminating at a contact for connection to the I/O module RIUP control signal PCB edge pad, and a normally closed passive make-before-break bypass data switch operatively associated with the coupled I/O module, the I/O module mechanically opening and closing the passive bypass data switch and the passive bypass data switch including a first switch contact operatively associated with the first data communication channel which also terminates at a first data communication contact for connection to the I/O module first communication channel PCB edge pad and a second switch contact operatively associated with the second data communication channel which also terminates at a second data communication contact for connection to the I/O module second communication channel PCB edge pad, wherein insertion of the I/O module to the backplane causes the following I/O module insertion timing sequence: a) at a first I/O module insertion position, electrical connection of the I/O module first communication channel PCB edge pad to the backplane first communication channel contact, and electrical connection of the I/O module second communication channel PCB edge pad to the backplane second communication channel contact, thereby providing data communication continuity through the I/O module bypass data switch and through the backplane passive makebefore-break bypass data switch; b) at a second I/O module insertion position, the second I/O module insertion position closer to the backplane than the first I/O module insertion position, mechanically breaking data communication continuity through the backplane make-before-break bypass data switch while maintaining data communication continuity through the I/O module bypass data switch; c) at a third I/O module insertion position, the third I/O module insertion position closer to the backplane than the first and second I/O module insertion positions, electrical connection of the I/O module RIUP control signal PCB edge pad to the backplane RIUP control signal line terminating contact; and d) the I/O module microcontroller executing an initialization routine which outputs a control signal to the I/O module bypass data switch to open, thereby connecting the backplane first data channel to the respective I/O module first data channel contact exclusive of being routed to the I/O module bypass data switch and connecting the backplane second data channel to the respective I/O module second data channel contact exclusive of being routed through the I/O module bypass data switch, and wherein removal of an I/O module from the backplane causes the following I/O module removal timing sequence: a) at a first I/O module removal position, electrical disconnection of I/O module RIUP control signal PCB edge pad to the backplane RIUP control signal line terminating contact; b) the I/O module microcontroller executing a shutdown routine which outputs a control signal to the I/O module bypass data switch to close, thereby routing the backplane first data channel and second data channel through the I/O module bypass data switch, c) at a second I/O module removal position, the second I/O module removal position further from the backplane than the first I/O module removal position, mechanically establishing data communication continuity through the backplane make-before-break bypass data switch while maintaining data communication continuity through the I/O module bypass data switch; d) at a third I/O module removal position, the third I/O module removal position further from the backplane than the first and second I/O module removal positions, electrical disconnection of the I/O module first communication channel PCB edge pad to the backplane first communication channel contact, and electrical disconnection of the I/O module second communication channel PCB edge pad to the backplane second communication channel contact.

In another embodiment of this disclosure, described is a control module for an industrial device, the control module comprising: a microcontroller operatively connected to a first data communication channel, a second data communication and a RIUP (Removable and Insertion Under Power) control signal line, and a normally closed control module bypass data switch operatively associated with the microcontroller to open and close the control module bypass data switch and each bypass data switch including a first switch contact operatively associated with the first data communication channel and a second switch contact associated with the second data communication channel, wherein the first data communication channel, the second data communication channel and the RIUP control signal line terminate on a plurality of respective printed circuit board (PCB) edge pads located near a PCB connection edge, the RIUP control signal line PCB edge pad offset from the PCB connection edge a greater distance relative to the first data communication channel and the second data communication channel PCB edge pad offsets from the PCB connection edge, wherein the plurality of respective printed circuit board (PCB) edge pads interface the first data communication channel, the second communication channel and the control signal line to an associated mounting base, the associated mounting base including a normally closed passive make-before-break bypass data switch which an insertion and removal of the control module from the mounting base mechanically opens and closes, respectively, the passive bypass data switch the passive bypass data switch including a first switch contact operatively associated with the first data communication channel which also terminates at a first data communication contact for connection to the first communication channel PCB edge pad and a second switch contact operatively associated with the second data communication channel which also terminates at a second data communication contact for connection to the second communication channel PCB edge pad, wherein the microcontroller is configured to execute instructions to control the control module bypass data switch, the control module bypass data switch operating in a first state to provide point-to-point data communications between two other control modules adjacent to the control module as the control module is removed from the associated mounting base, and a second state to provide point-to-point data communications between the control module and the two other control modules adjacent the control module after the control module is inserted to the mounting base.

In yet another embodiment of this disclosure, described is a point-to-point backplane for an industrial control device comprising: a plurality of mounting bases configured to removably couple a plurality of respective I/O (Input/Output) modules, each mounting base including a passive bypass data switch operatively associated with a respective I/O module which an insertion and removal of the I/O module from the mounting base mechanically opens and closes, respectively, the passive bypass data switch, the passive bypass data switch including a first switch contact operatively associated with a first data communication channel which also terminates at a first data communication contact for connection to an I/O module first communication channel PCB edge pad and a second switch contact operatively associated with the second data communication channel which also terminates at a second data communication contact for connection to an I/O module second communication channel PCB edge pad.

BRIEF DESCRIPTION OF THE DRAWINGS

FIG. 1 is an isometric detail view of a conventional point module arrangement.

FIGS. 29A, 29B, 29C, and 29D, (collectively referred to as FIG. 29) and FIGS. 30A, 30B, 30C and 30D (collectively referred to as FIG. 30) show a module PCB edge connector being removed from a mating mounting base connector, according to an exemplary embodiment of this disclosure, (29A and 30A) showing the PCB edge connector and mounting base fully connected, (29B and 30B) showing an initial rotation of the PCB edge connector, (29C and 30C) showing a second position of rotation of the PCB edge connector, and (29D and 30D) showing a disengagement of the PCB edge connector from the mounting base connector.

DETAILED DESCRIPTION

This disclosure provides a RIUP point-to-point backplane and module architecture to enable relatively minimum or no loss of data communications to other modules, i.e., downstream modules, during an RIUP operation including the removal of a point module from the backplane and the insertion of a point module to the backplane. Furthermore, the disclosed RIUP point-to-point backplane and module architecture include a passive backplane data switch to enable the minimum or no loss of data communications to other modules.

To enable the use of a passive backplane data switch, according to an exemplary embodiment, the disclosed systems/subsystems work in unison to enable bumpless RIUP while using a passive mounting base on a point-to-point backplane for removal and insertion of a module under power (RIUP) without interruption, i.e., bumpless removal and insertion.

The mechanical/electrical subsystems, working in unison, include:
1) Mounting base pins of type make-before-break;
2) Normally-closed switch bridging the backplane bus on the module;
3) A loopback connection on the last pair of mounting base pins; and
4) Module's PCB edge pads of varying lengths.

1) Mounting base pins of type make-before-break; and 2) Normally-closed switch bridging the backplane bus on the module.

The PCB edge pads make contact to the mounting base pins and bridge the signal path before the path is broken. Therefore, at no time is the signal path interrupted. The normally-closed switch enable signal passthrough even in absence of electrical power. The switch can be implemented by a relay, or a depletion mode MOSFET. This is the basis for the bumpless RIUP.

3) A loopback connection on the last pair of mounting base pins; and 4) Module's PCB edge pads of varying lengths.

The different lengths of PCB edge pads created a specific timing sequence for the various contact points to engage and disengage. This timing sequence has to be followed precisely to ensure bumpless RIUP. The HP (HotPlug) signal has the shortest length, i.e. this is "the last pair" of mounting base pins.

While the disclosed embodiments include the use of 1) mounting base pins of type make-before-break; 2) normally-closed switch bridging the backplane bus on the module; 3) a loopback connection on the last pair of mounting base pins; and 4) a module's PCB edge pads of varying lengths, in combination or unison, it is to be understood that the claims are not limited to a combination of all of these features. For example, but not limited to, an industrial control device/control module/backplane that includes a subset of features 1)-4).

Advantages and/or benefits of the disclosed embodiments include enablement of a passive mounting base in a point-to-point backplane which is less expensive than an active mounting base, while providing maintaining a point-to-point backplane which is faster than multi-point backplanes.

Figure 2:
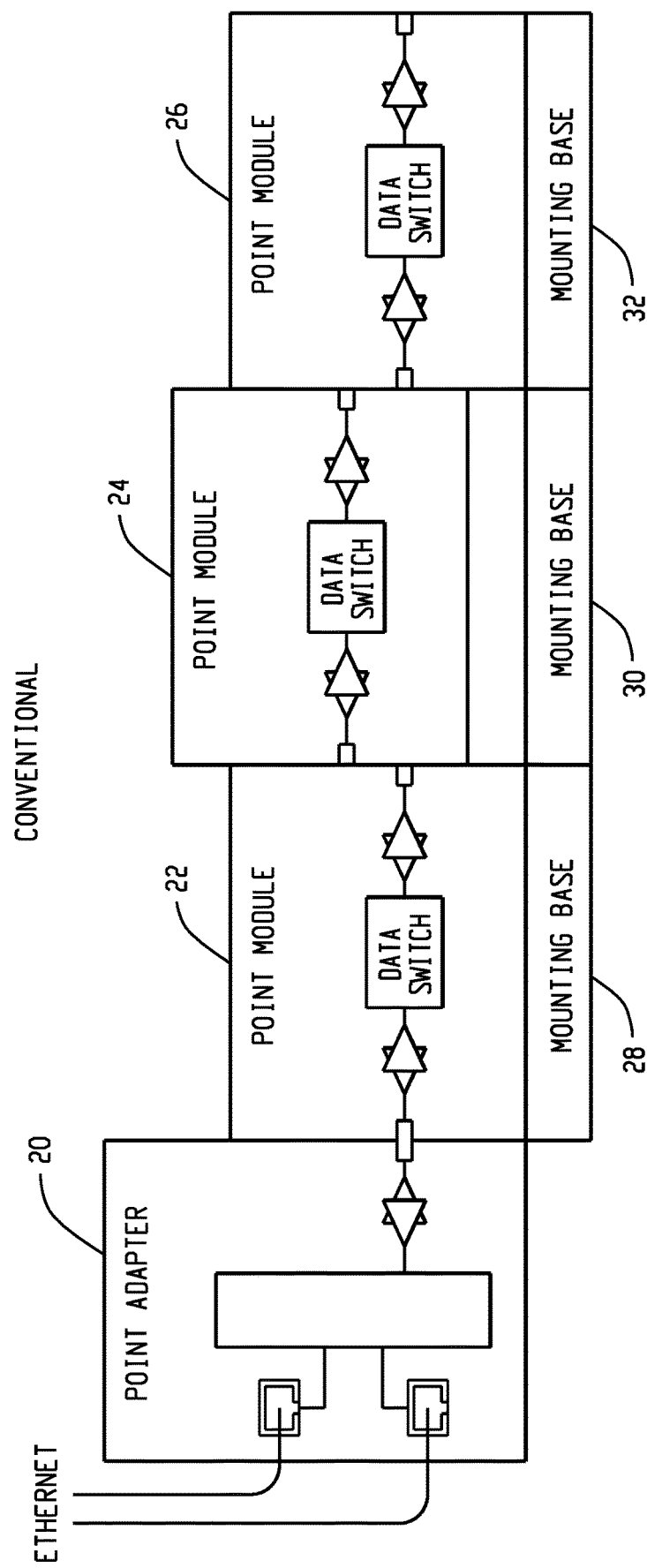
FIG. 2 shows a conventional point-to-point backplane/module arrangement.
Figure 3:
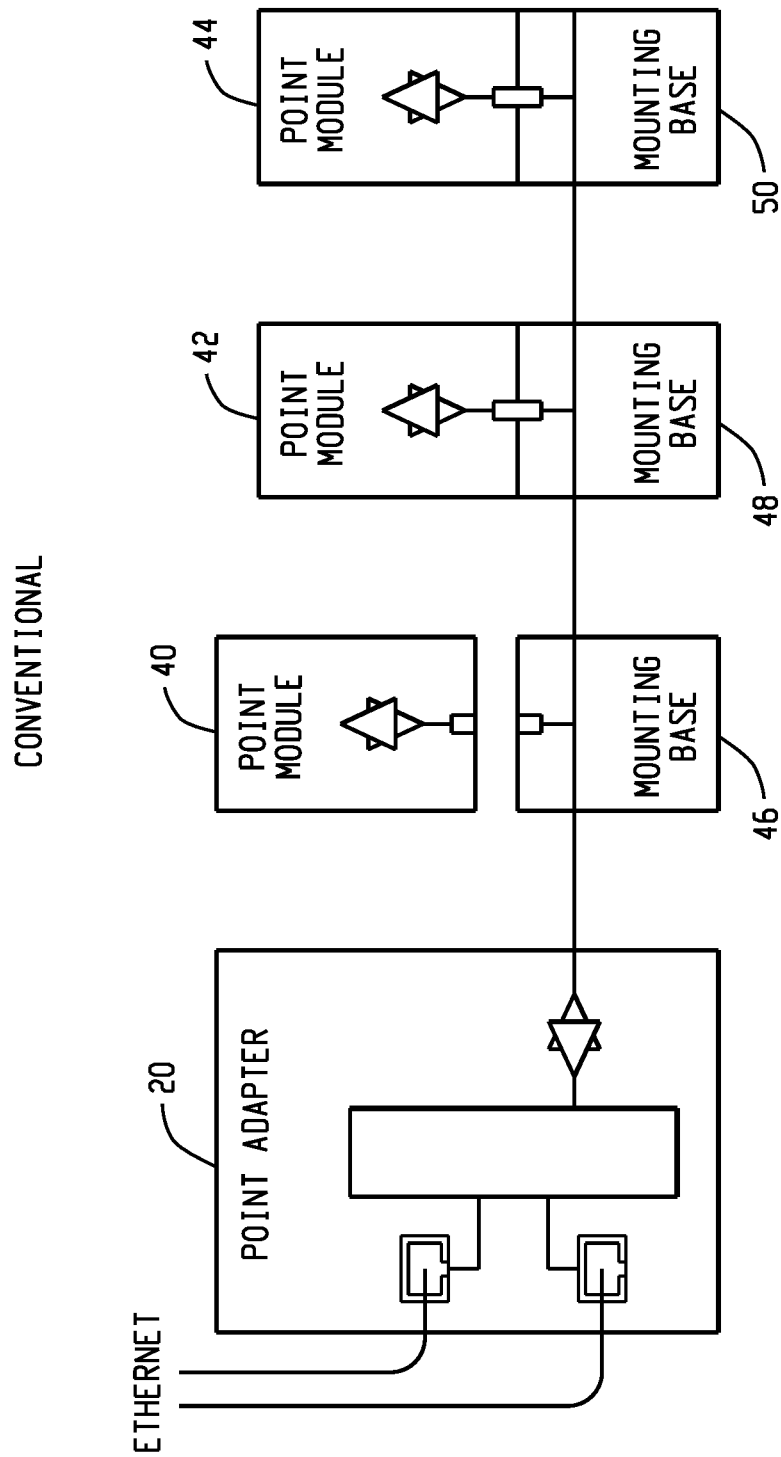
FIG. 3 shows a conventional multi-point backplane/module arrangement.
Figure 4A:
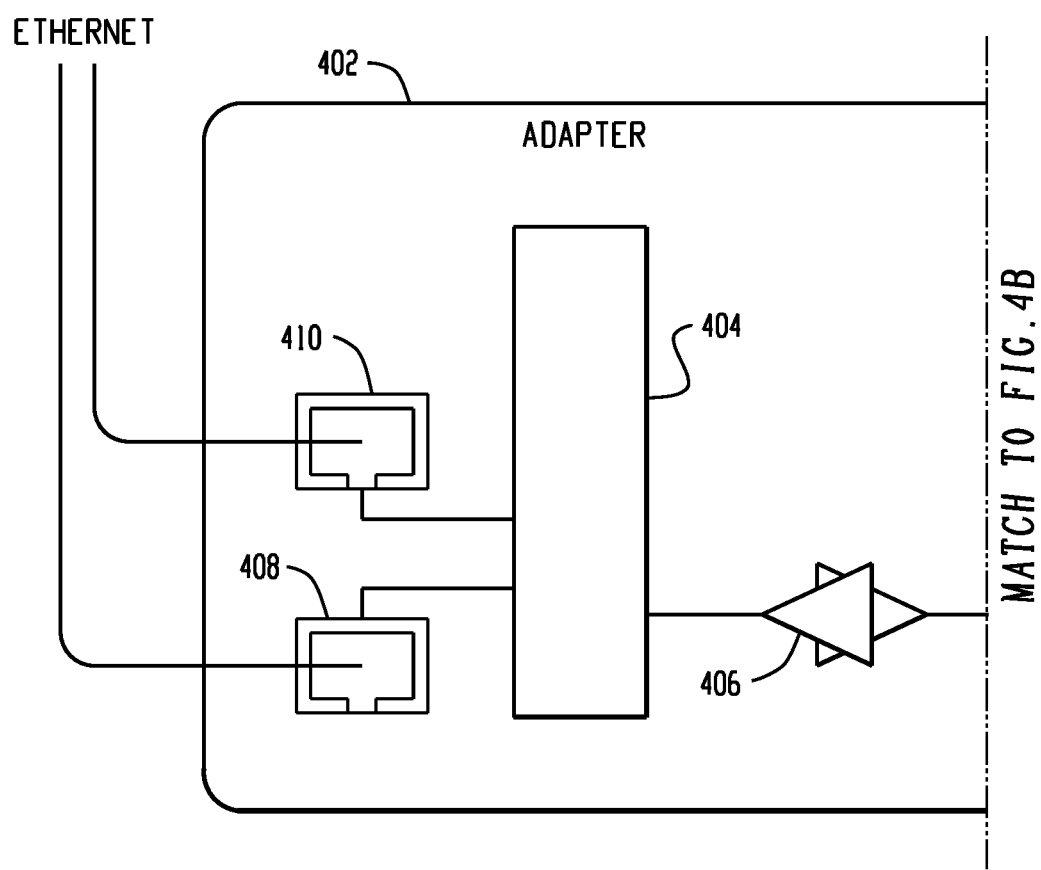
FIGS. 4A, 4B and 4C (collectively referred to as FIG. 4) are a schematic of a point-to-point RIUP backplane/module architecture according to an exemplary embodiment of this disclosure.
Figure 4B:
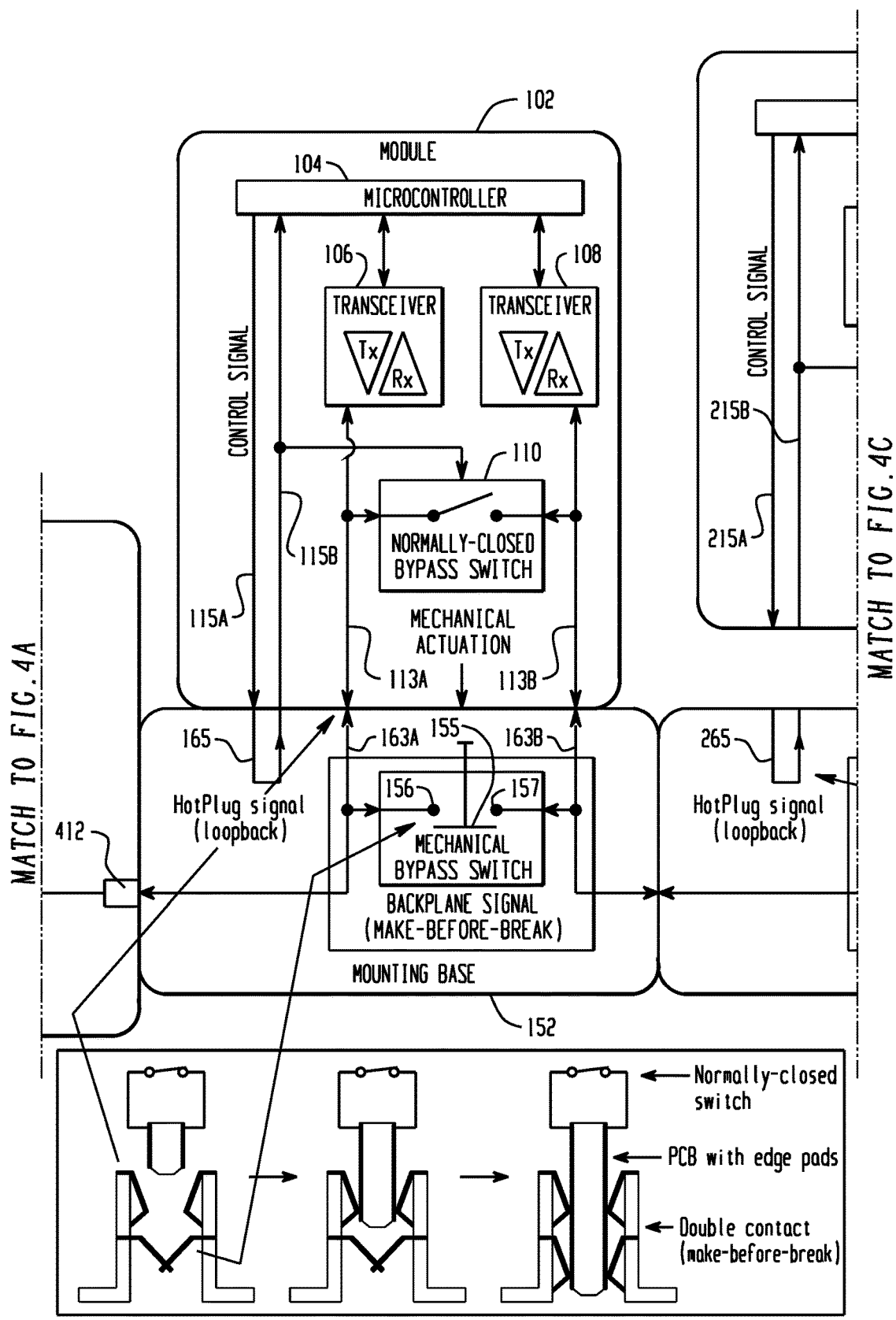
Figure 4C:
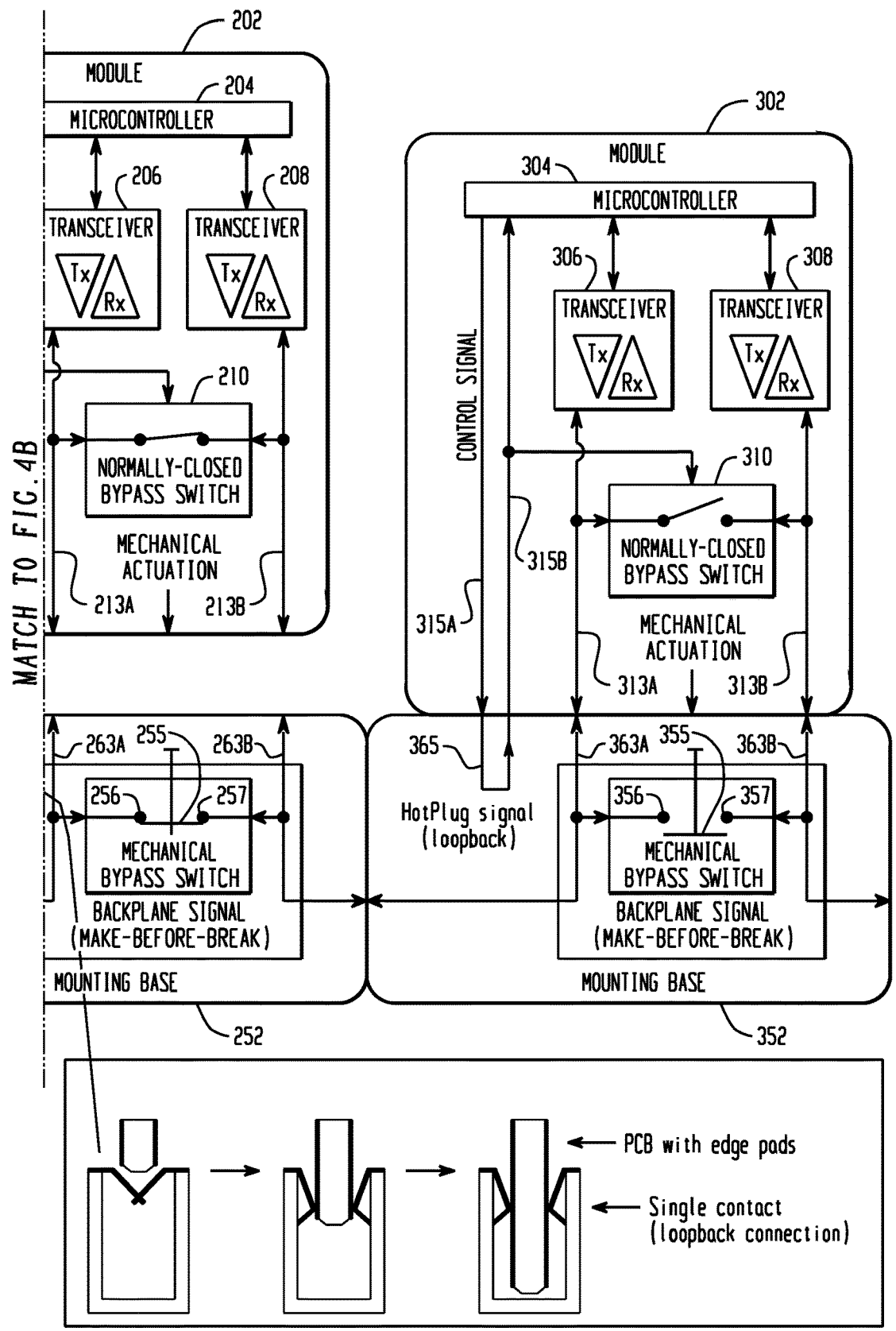

The detailed description which follows focuses on a distributed I/O control device, as shown in FIG. 4, including a plurality of modules 102, 202 and 302, such as input modules and/or output modules, an Ethernet adaptor module 402 operatively connected to the plurality of modules 102 and 302, as illustrated, which communicates with an external network and/or other Ethernet enabled device, and mounting bases 152, 252 and 352. However, it is to be understood that the disclosed subject matter and exemplary embodiments described are not limited to a particular type of point module and point adaptor modules and the disclosed point-to-point RIUP architecture provided herein can be applied to other point modules, such as, but not limited to, PLCS (Programmable Logic Controllers), custom field devices, machine controllers, etc.

As shown in FIG. 4, the exemplary distributed I/O control device includes an Ethernet adapter module 402 including Ethernet ports 410 and 408, an Ethernet communication microprocessor 404, transceiver 406, and connector 412, which provides a data communications interface with adjacent mounting base 152.

Mounting bases 152, 252 and 352 provide communication via transceiver communication channels 113A/163A, 113B/163B, 213A/263A, 213B/363B, 313A/363A and 313B/363B and operatively connect to modules 102, 202 and 302 via dedicated connectors where each connector includes a RIUP hot plug loopback signal 115A/115B/165, and TX/RX data signals 113A/163A 113B/163B 213A/263A, 213B/263B, 313A/363A and 313B/363B. RIUP hot plug signal is operatively associated with controlling module bypass switches 110, 210 and 310 which, in part, control the routing of data communications to and from each module microcontroller 104, 204 and 304. Mounting base 152 also includes mechanical bypass switch 155 including mechanical bypass switch terminal A 156 and mechanical bypass switch terminal B 157. Mounting base 252 also includes mechanical bypass switch 255 including mechanical bypass switch terminal A 256 and mechanical bypass switch terminal B 257. Mounting base 352 also includes Mechanical bypass switch 355 including mechanical bypass switch terminal A 356 and mechanical bypass switch terminal B 357.

I/O module 102 include transceivers 106 and 108, and RIUP control signal lines 115A and 115B. I/O module 202 include transceivers 206 and 208, and RIUP control signal lines 215A and 215B. I/O module 302 include transceivers 306 and 308, and RIUP control signal lines 315A and 315B. I/O module 102 further includes microcontroller 104, normally-closed bypass switch 110, transceiver communication channel 113A, transceiver communication channel 113B, control signal 115A, and control signal 115B. I/O module 202 further includes microcontroller 204, normally-closed bypass switch 210, transceiver communication channel 213A, transceiver communication channel 213B, control signal 215A, and control signal 215B. I/O module 302 further includes microcontroller 304, normally-closed bypass switch 310, transceiver communication channel 313A, transceiver communication channel 313B, control signal 315A, and control signal 315B.

FIG. 4 shows I/O module 202 removed from mounting base 252. Also shown are detail views of a) mounting base 1 normally-closed mechanical bypass switch 155 connection to I/O module 102 as I/O module 102 is inserted into mounting base 152, and b) mounting base 252 hotplug (loopback) signal connection to I/O module 202 as I/O module 202 is inserted into mounting base 252.

The mounting base 152 normally-closed mechanical bypass switch 155 is implemented as a make-before-break contact arrangement for insertion of an I/O module into a respective mounting base, this arrangement including a double contact arrangement, as illustrated, used in conjunction with I/O module edge pads aligned on opposites sides of a PCB for insertion into the double contact. Mounting base 252 and mounting base 352, as well as I/O module 202 and I/O module 302, include similar arrangements, however detail views are not shown.

As I/O module 102 is inserted into mounting base 152, with I/O module 102 normally-closed bypass switch in a closed position, PCB edge pads operatively connected to transceiver communication channel 113A and transceiver communication channel 113B initially come in contact with a top set of normally open contacts, and subsequently during insertion, come in contact with a second set of contacts represented as mechanical bypass switch 155. During removal of I/O module 102 from mounting base 152, the opposite sequence of contact events takes place. In other words, during insertion of I/O module 102 into mounting base 152, the described double contact arrangement "makes" connections of mounting base transceiver communication channel 163A to transceiver communication channel 113A, and mounting base transceiver communication channel 163B to transceiver communication channel 113B, where the I/O module 102 normally closed data bypass switch routes data from the adapter 402 (or adjacent I/O module) to I/O module 202, bypassing I/O module 102 transceivers 106 and 108, and, simultaneously, mounting base 152 normally-closed mechanical bypass switch 155 continues to routes data from the adapter 402 (or adjacent I/O module) to I/O module 252, bypassing I/O module 102. (i.e., "before break", "make"). Next, as the I/O module 102 is inserted further into mounting base 152 connector, the second set of lower double contacts "break" the direct contact/electrical continuity connection of transceiver communication channel 163A to transceiver communication channel 163B (i.e., "break").

The mounting base hot plug signal loopback connections 165/265/365 are implemented as a single contact as shown with reference to I/O module 202 and mounting base 252. During insertion of an I/O module into a respective mounting base, this arrangement provides a loopback signal to the respective I/O module controller after the "make-before-break" connection is completed, thereby signaling the respective microcontroller can execute initialization commands to bring the connected I/O module on-line and open the respective I/O module normally closes bypass switch. According to an exemplary embodiment provided herein, the I/O module PCB edge pad associated with the loopback signal is shorter in length than the I/O module PCB edge pads associated with transceiver communication channels, where a loopback signal is not provided to the respective I/O module until PCB edge pads operatively connected to the transceiver A communication channels (i.e., 113A, 213A, or 313A) and transceiver B communication channels (i.e. 113B, 213B, or 313B) both come in contact with the top set of normally open contacts, and come in contact with the second set of contacts associated with their respective mechanical bypass switch 155/255/355.

During normal operation of the distributed I/O control device shown in FIG. 4, modules 102 and 302 are connected to mounting bases 152 and 352, respectively, and module bypass switches 110 and 310 are open and passive backplane mechanical bypass switches 155 and 355 are open, while the passive backplane mechanical bypass switches 255 associated with module 202 (which is removed from the backplane) is closed, thereby routing data communications to modules 102 and 302 in a point-to-point fashion. In other words, data communications are routed from transceiver 108 to transceiver 306, via backplane communication channel signal lines 162, 263A, backplane bypass switch 255, backplane communication channel signal lines 263B and 363A.

Figure 5:
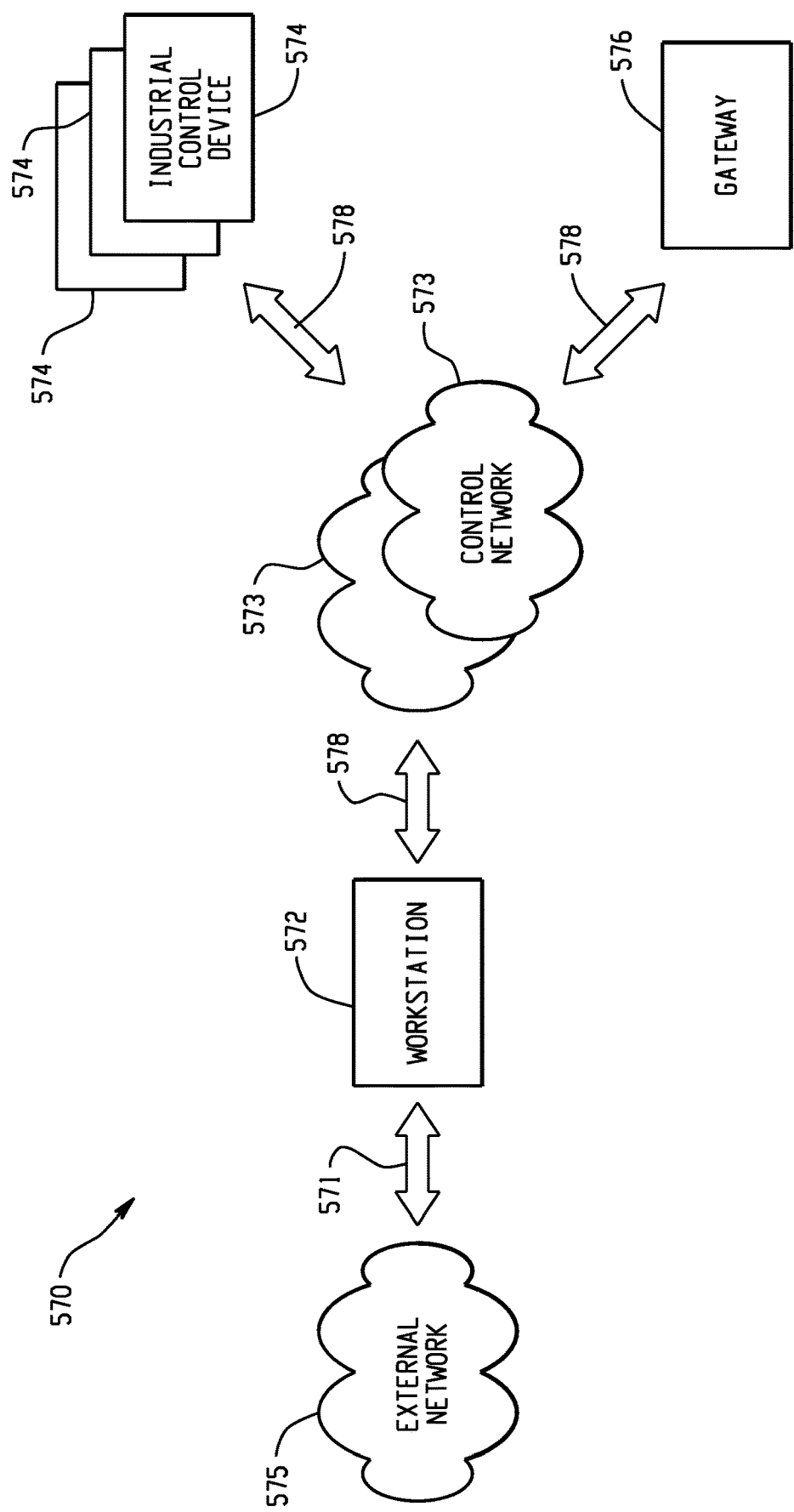
FIG. 5 shows an example of the architecture of a distributed industrial process control system which includes an industrial device according to an exemplary embodiment of this disclosure.

With reference to FIG. 5, shown is an example of the architecture of a distributed industrial process control system which includes an industrial device according to an exemplary embodiment of this disclosure.

In the Industrial Process Control System shown in FIG. 5, a distributed architecture is designed to be used in different SIL (Safety Integrity Level) environments, so that if a high SIL is required it can be provided, but if a low SIL is all that is needed, the system can be reduced in complexity in order to reduce unnecessary extra costs.

An exemplary Industrial Process Control System 570, comprises a workstation 572 one or more controllers 574 and a gateway 576. The workstation 572 communicates with the controllers 574 and the gateway 576 via Ethernet connections 578 to one or more control networks 573. Multiple Ethernet connections 578 provide redundancy to improve fault tolerance. The workstation 572 may be connected via a conventional Ethernet connection 571 to another external network 575.

An exemplary controller 574 will now be described in more detail with reference to FIGS. 6 and 7.

Figure 6:
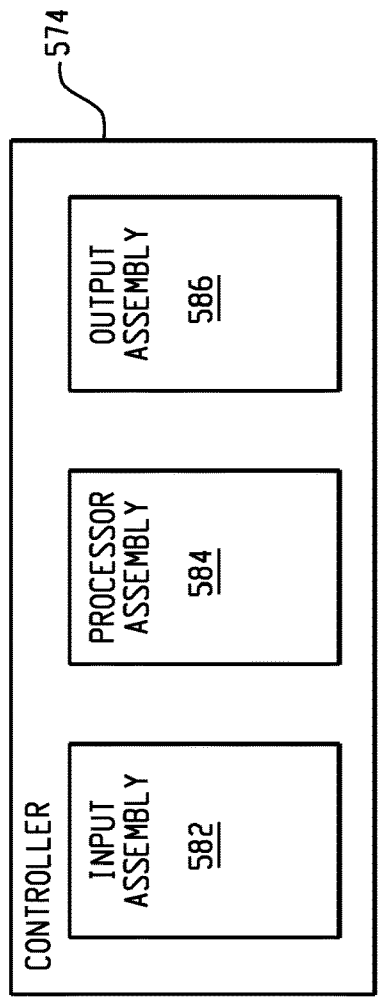
FIG. 6 is a block diagram of an industrial controller/device according to an exemplary embodiment of this disclosure.

FIG. 6 illustrates a schematic diagram of the controller 574 comprising an input assembly 582, a processor assembly 584 and an output assembly 586. In this schematic illustration, the input assembly 582 and output assembly 586 are on different backplanes but they may equally well share a single backplane.

Assemblies 582, 584, 586 are created from one or more communications backplane portions which have three slots to accommodate up to three modules together with termination assemblies which have one two or three slots, and which interface to field sensors and transducers. A termination assembly may straddle two contiguous backplane portions. A module comprises a plug in card with multiple connectors for plugging onto a communications backplane and a termination assembly.

It will be appreciated that having three slots in a communications backplane portion is one design option and other design options with greater (or fewer) slots are possible without departing from the scope of this disclosure as defined in the appended claims.

Figure 7:
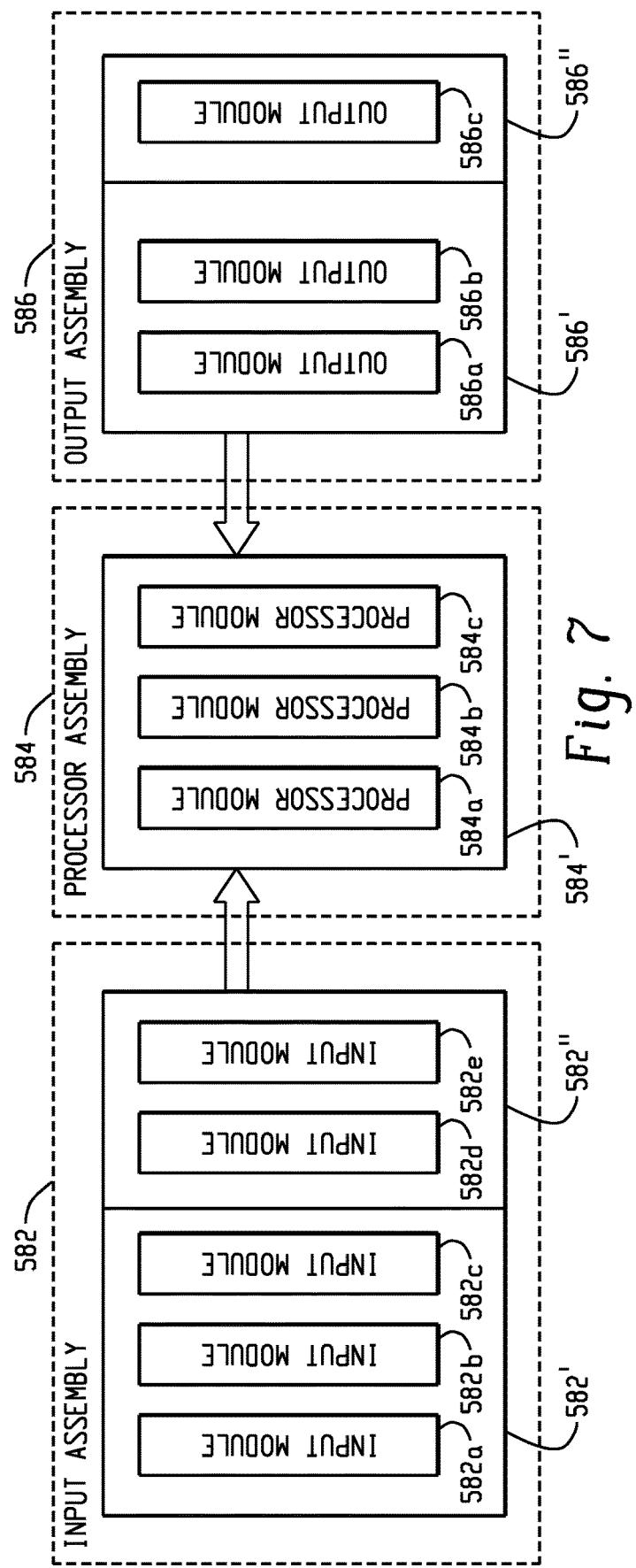
FIG. 7 is another block diagram of an industrial controller/device according to an exemplary embodiment of this disclosure.

FIG. 7 illustrates a possible physical configuration of the controller 574. According to this exemplary embodiment, the input assembly 582, output assembly 586 and processor assembly 584 are physically separated from one another by grouping the modules of different types onto separate communications backplanes.

In the example shown, the input assembly 582 comprises two communications backplane portions, 582', 582". The first backplane portion 582' has a triplex input termination assembly and three input modules 582a, 582b, 582c, the second backplane portion 582" has a duplex input termination assembly 582" and two input modules 582d, 582e. The processor assembly 584 comprises a single processor backplane portion 584' having three processor modules 584a, 584b and 584c. The output assembly 586 comprises two backplane portions 586', 586". The first backplane portion 586' has a duplex output termination assembly with two output modules 586a, 586b and the second backplane portion 586" has a simplex output termination assembly with a single output module 586c.

Figure 8:
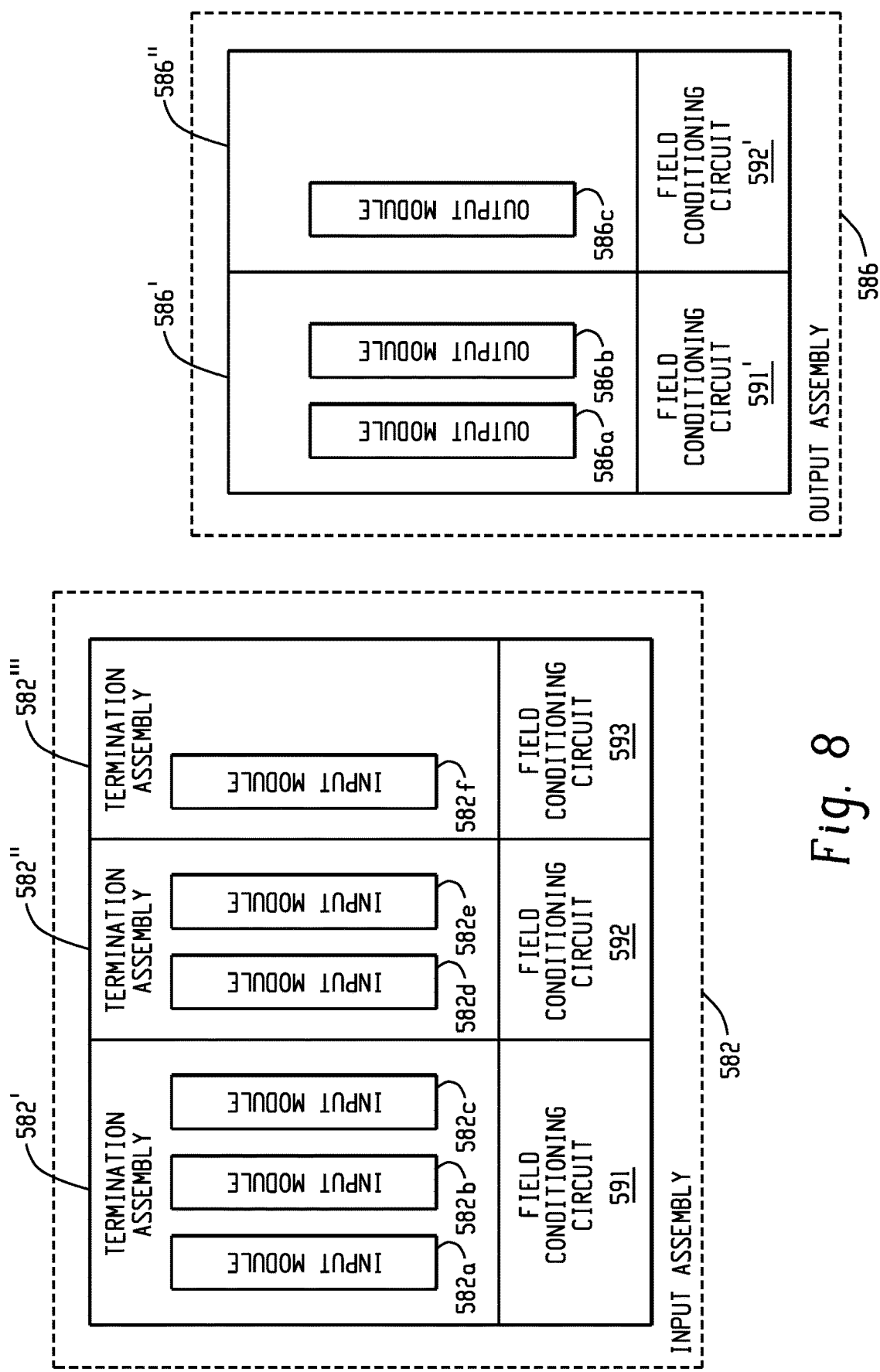
FIG. 8 is a block diagram including possible configurations of an input assembly and output assembly according to an exemplary embodiment of this disclosure.

The flexibility of the input assembly 582, will now be described, in more detail with reference to FIG. 8.

An input assembly 582 comprises one or more backplane portions and termination assemblies 582' 582" 582'" etc. For example, a triplex portion 582' having three modules 582a, 582b, 582c might be used for high availability requirement, a duplex portion 582" having two modules 582d, 582e might be provided for fault tolerant applications and a simplex portion 582'" with a single module 582f might be provided for failsafe applications. The termination assemblies may be provided with different types of field conditioning circuits. For example, assembly 582' may be provided with a 184V DC field conditioning circuit 591, assembly 582" may be provided with a 120V DC field conditioning circuit 592, and assembly 582''' may be provided with a 4-20 mA field conditioning circuit 593. Similarly possible configurations are shown for an output assembly 586. It will be appreciated that numerous configurations of backplane portions and termination assemblies with various different numbers of modules and various different types of field conditioning circuits are possible and this disclosure is not limited to those shown in these examples.

Where an assembly provides more than one module for redundancy purposes it is possible to replace a failed module with a replacement module whilst the industrial process control system is operational which is also referred to herein as online replacement (i.e., replacement is possible without having to perform a system shutdown). Online replacement is not possible for a simplex assembly without interruption to the process. In this case various "hold last state" strategies may be acceptable or a sensor signal may also be routed to a different module somewhere else in the system.

The processor assembly configures a replacement processor module using data from a parallel module before the replacement module becomes active.

The field conditioning circuits 591, 592, 593 transform a signal received from a sensor monitoring industrial process control equipment to a desired voltage range, and distribute the signal to the input modules as required. Each field conditioning circuit 591, 592, 593 is also connected to field power and field return (or ground) which may be independently isolated on a channel by channel basis from all other grounds, depending on the configuration of the input termination assembly. Independent channel isolation is the preferred configuration because it is the most flexible. The field conditioning circuits 591, 592, 593 comprise simple non active parts and are not online replaceable.

Further details of an industrial control device and method for insertion and removal of a module under power without interruption, according to various exemplary embodiments, are now provided below. Initially described are FIGS. 9-17 which illustrate the insertion and removal of a control module from a backplane/mounting base, where the control module edge pads have various lengths, i.e., the edge pads terminate at different distances from the connecting PCB edge, thereby providing a controlled timing sequence of connections with the mounting base.

Figure 10:
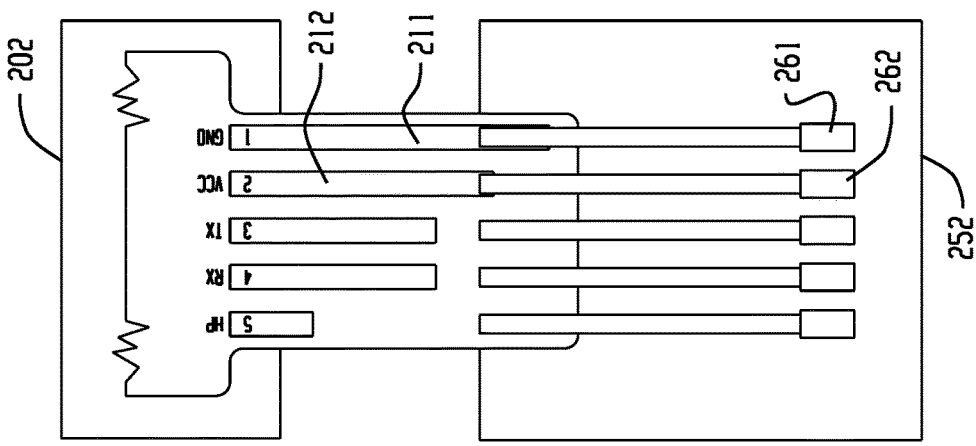
FIGS. 9 and 10 are flow charts and schematics showing an initial and a subsequent, second, action on a module, and respective position of the module, inserted into a mounting base during a module insertion sequence inserting a module into the mounting base according to an exemplary embodiment of this disclosure.
Figure 10:
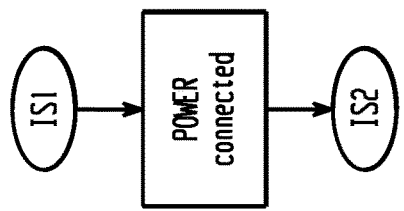
Figure 9:
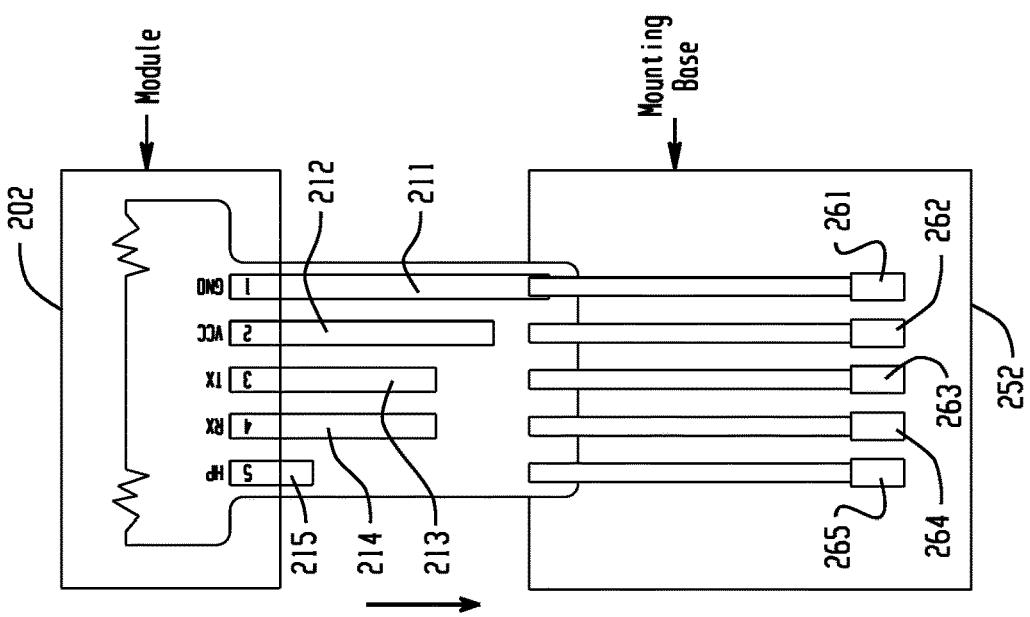
Figure 9:
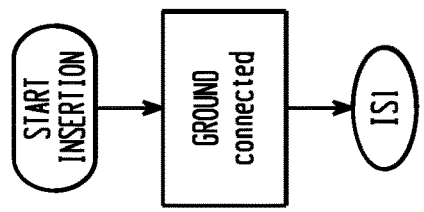
Figure 11:
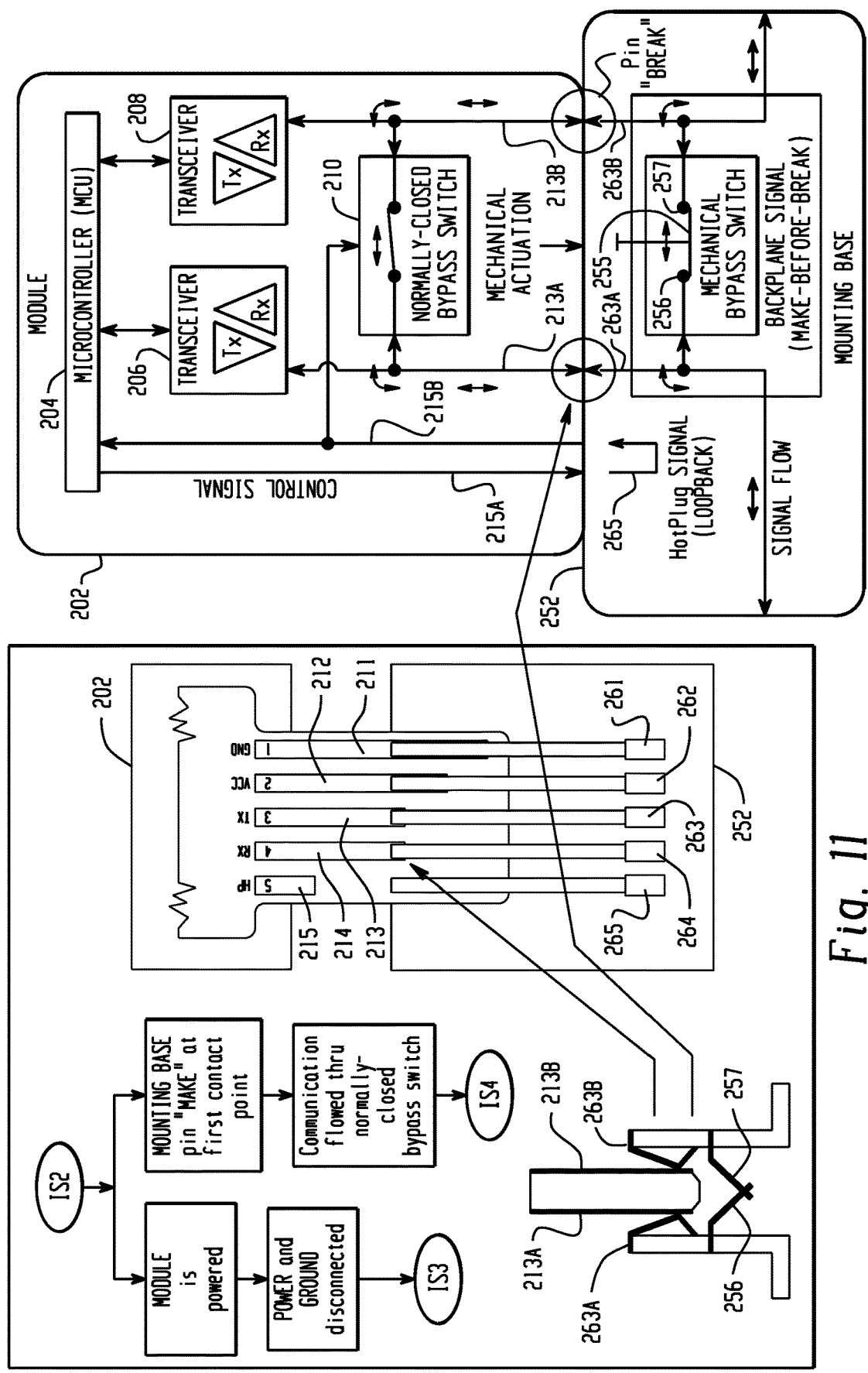
FIG. 11 is a flow chart and schematic showing a third action on the module shown in FIGS. 9 and 10, and respective position of the module, inserted into a mounting base during a module insertion sequence inserting a module into the mounting base according to an exemplary embodiment of this disclosure.
Figure 12:
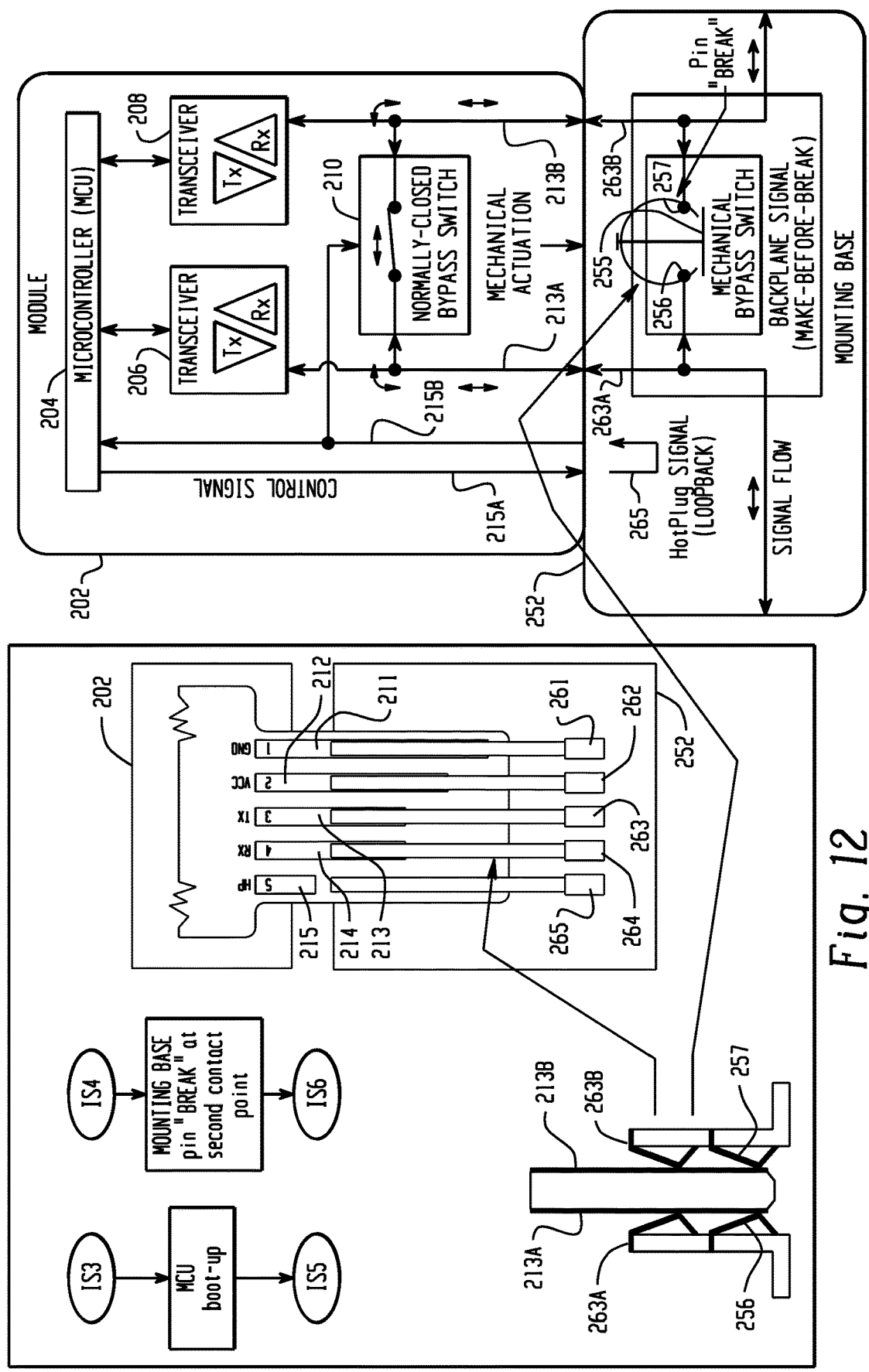
FIG. 12 is a flow chart and schematic showing a fourth action on the module shown in FIG. 11, and respective position of the module, inserted into a mounting base during a module insertion sequence inserting a module into the mounting base according to an exemplary embodiment of this disclosure.

With reference to FIGS. 9 and 10, shown are flow charts and schematics showing an initial and subsequent action on a module, and respective position of the module, inserted into a mounting base during a module insertion sequence inserting a module into the mounting base according to an exemplary embodiment of this disclosure.

Initially, (FIG. 9) a ground connection, 211 and 261 is made, while the shorter edge pads associated with VCC power 212, TX signal 213, RX signal 214 and HP signal 215, remain unconnected to mounting base 252.

Next, (FIG. 10) as the module PCB is inserted further into mounting base 252 connector, a VCC power connection of 212 and 262 is made, while the shorter edge pads associated with TX signal 213, RX signal 214 and HP signal 215, remain unconnected to mounting base 252.

Next, (FIG. 11) as the module PCB is inserted further into mounting base 252 connector, a TX signal 213 connection of 263 is made and a RX signal 214 connection of 264 is made, while the shorter edge pads associated with the HP signal 215 remains unconnected to mounting base 252.

Next, (FIG. 12) as the module PCB is inserted further into mounting base 252 connector, the bottom contact of the mounting base connection is broken, thereby routing transceiver communications from the mounting base only thru the module normally closed bypass switch, while the shorter edge pads associated with the HP signal 215 remains unconnected to mounting base 252.

Next, (FIG. 13) as the module PCB is inserted further into mounting base 252 connector, a HP signal 215 loopback connection of 265 is made, thereby completing the physical connection of I/O module 202 to mounting base 252.

Figure 13:
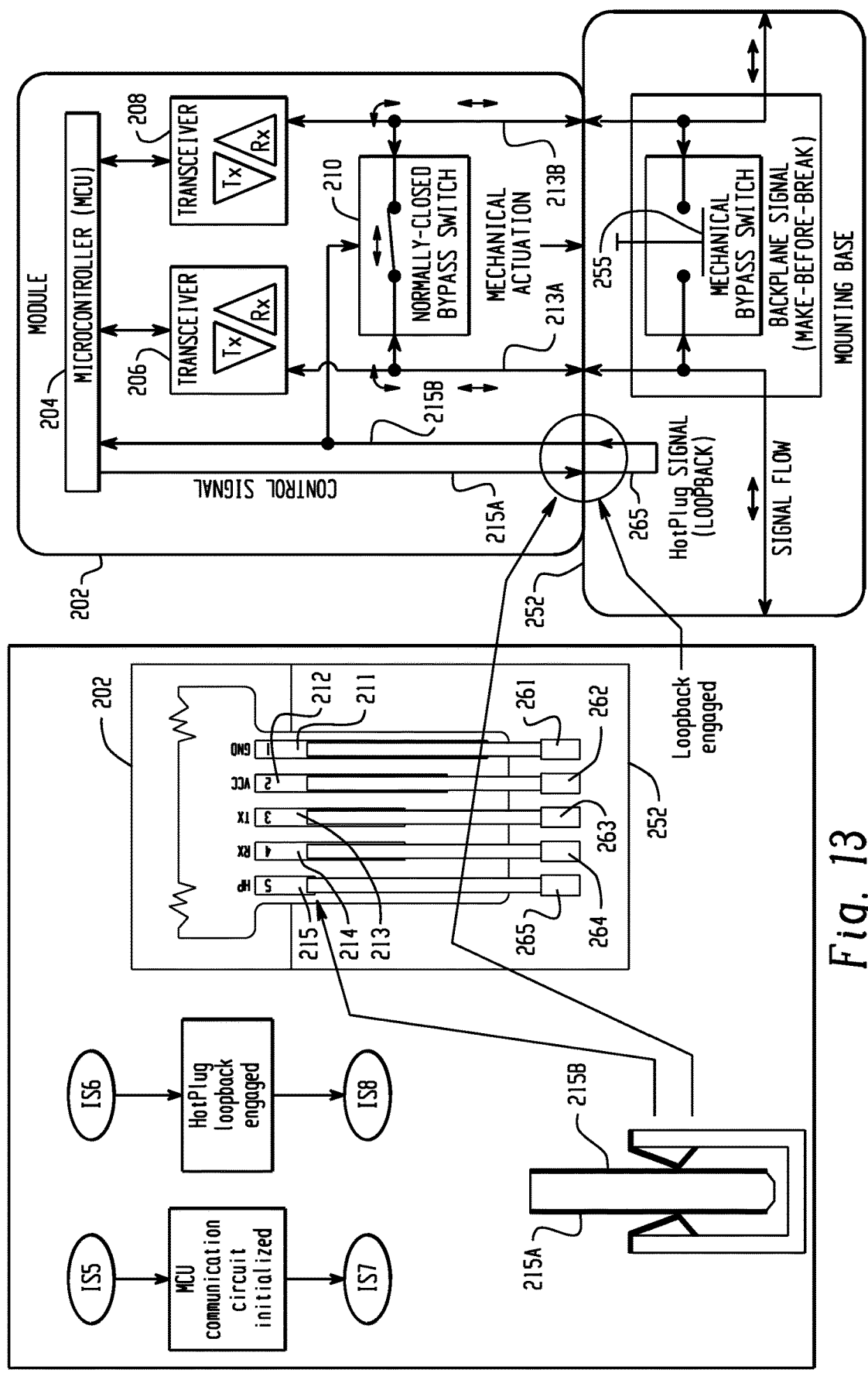
FIG. 13 is a flow chart and schematic showing a fifth action on the module shown in FIG. 12, and respective position of the module, inserted into a mounting base during a module insertion sequence inserting a module into the mounting base according to an exemplary embodiment of this disclosure.
Figure 14:
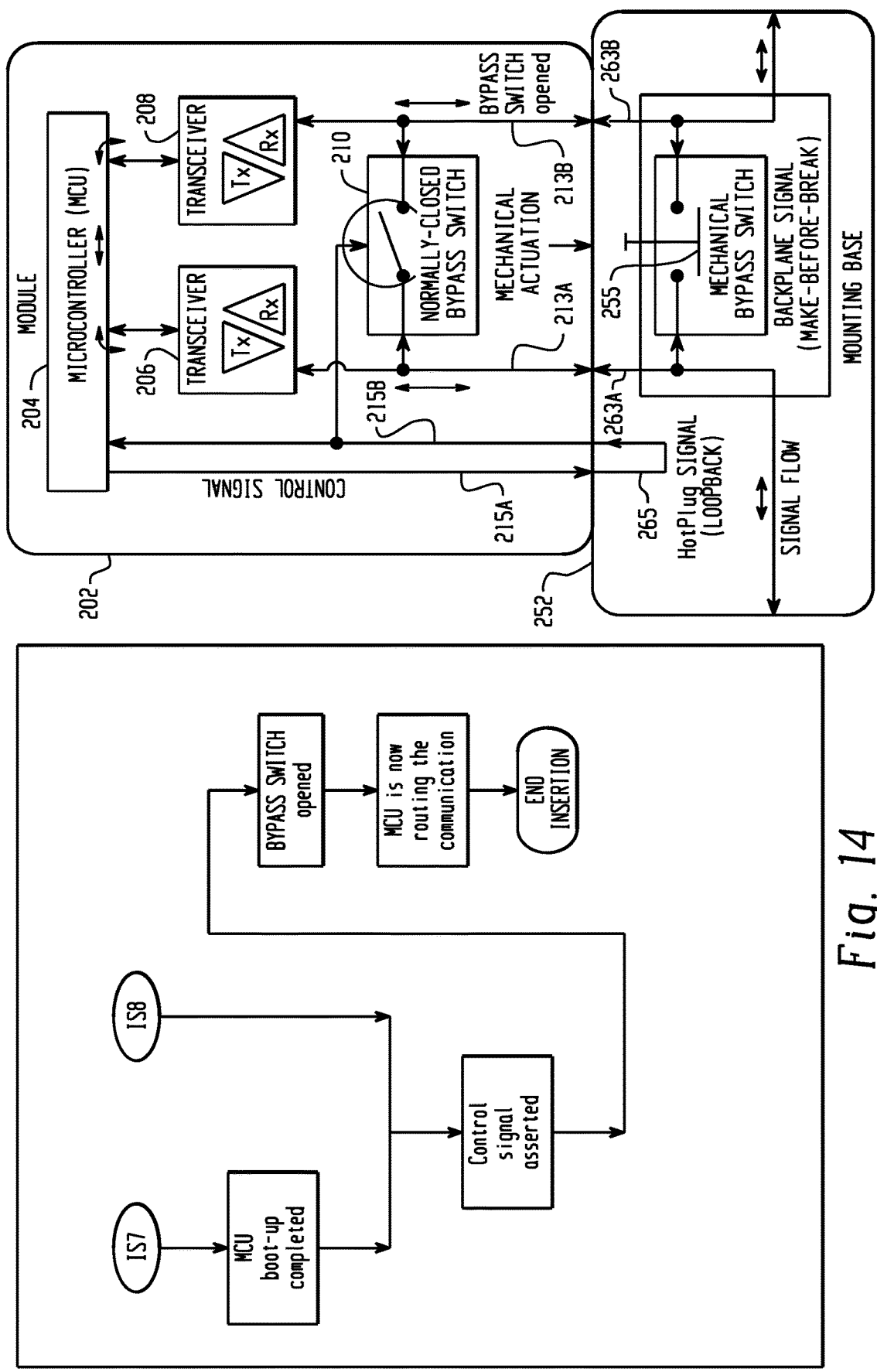
FIG. 14 is a flow chart and schematic showing a MCU bootup and routing communication sequence executed by the MCU after the fifth action on the module shown in FIG. 13, FIG. 13 completing the physical connection of the module to the mounting base, according to an exemplary embodiment of this disclosure.

FIG. 14 is a flow chart and schematic showing a MCU bootup and routing communication sequence executed by the MCU after the action on the module shown in FIG. 13, FIG. 13 completing the physical connection of the module to the mounting base, according to an exemplary embodiment of this disclosure.

Initially, the MCU boots up; and

Next, the MC activates a control signal to open the normally closed bypass data switch 210 and begins routing communication data in a point-to-point fashion with adjacent modules via the mounting base.

Figure 15:
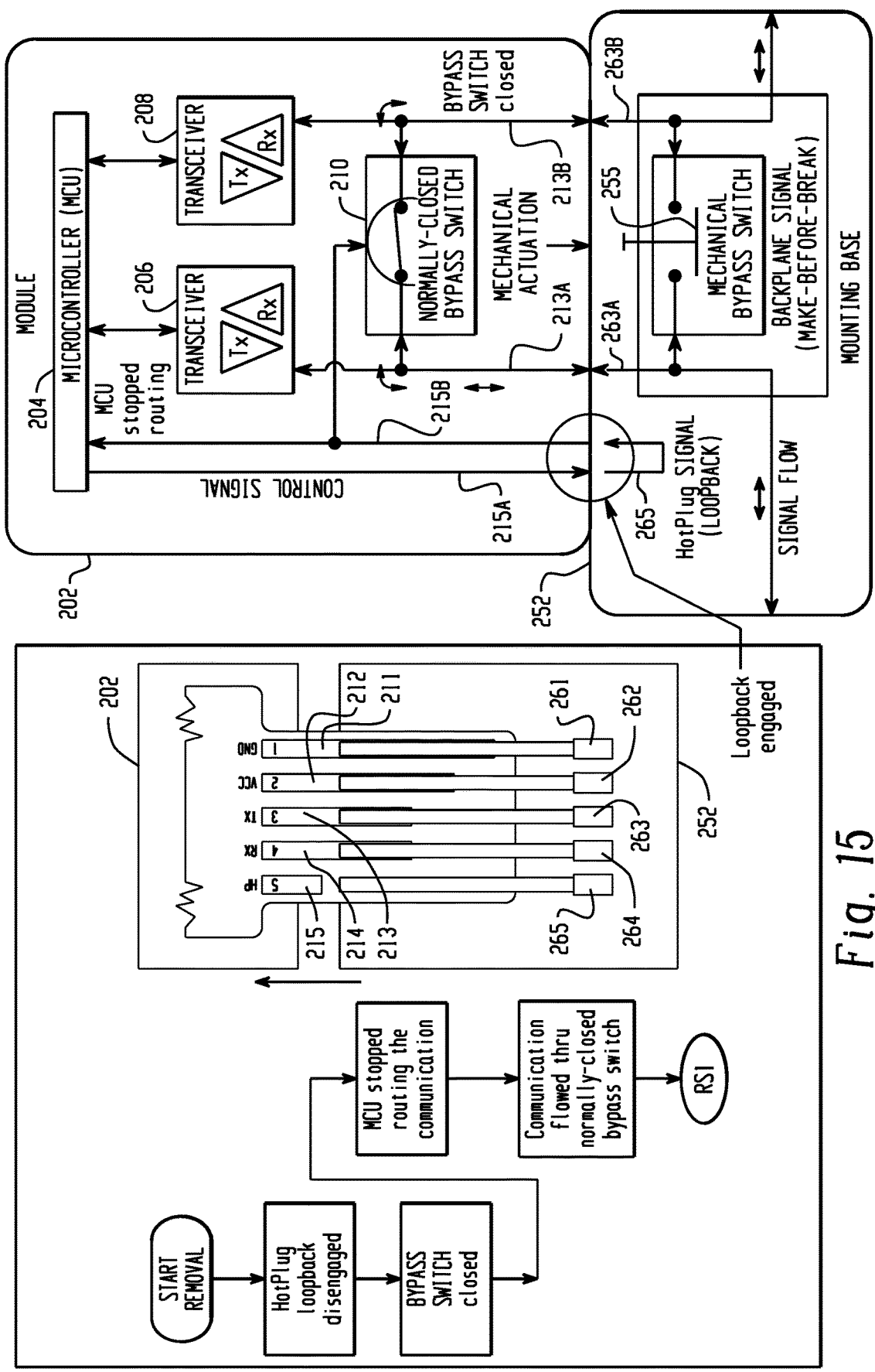
FIG. 15 is a flow chart and schematics showing an initial action on a module, and respective position of the module, removed from a mounting base during a module removal sequence removing a module from the mounting base according to an exemplary embodiment of this disclosure.
Figure 16:
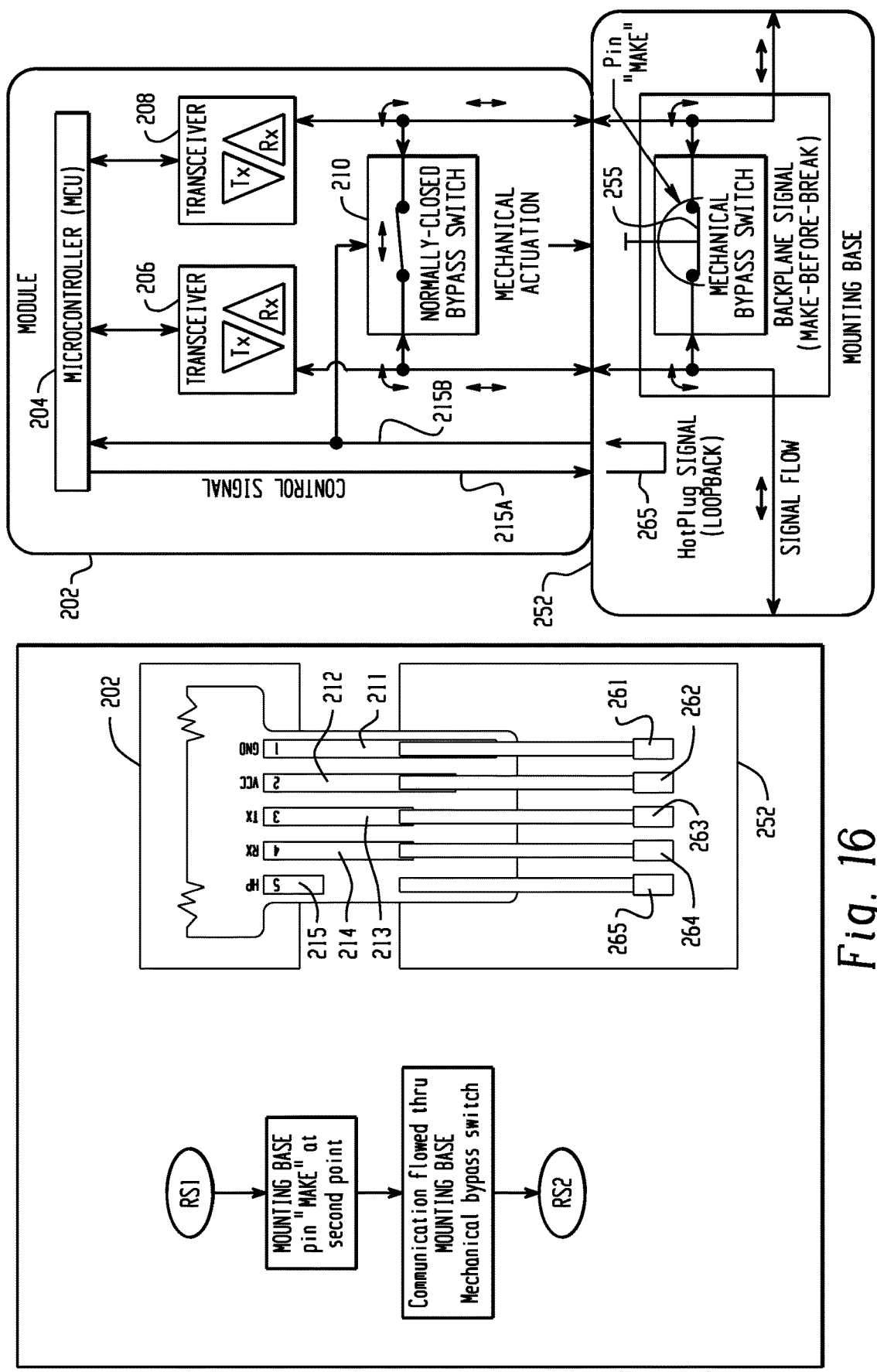
FIG. 16 is a flow chart and schematics showing a second action on a module, and respective position of the module, removed from a mounting base during a module removal sequence removing a module from the mounting base according to an exemplary embodiment of this disclosure.
Figure 17:
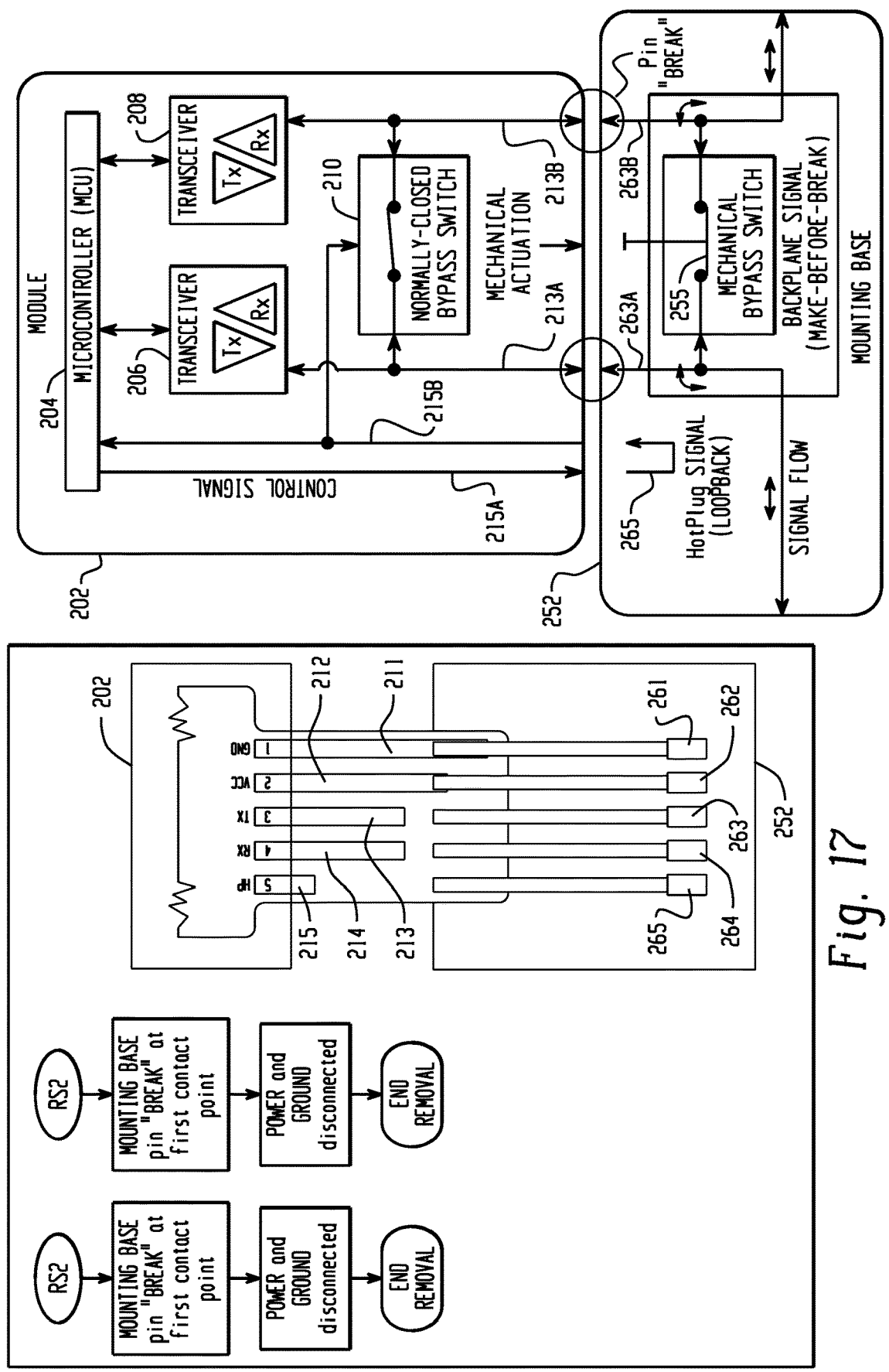
FIG. 17 is a flow chart and schematics showing a third action on a module, and respective position of the module, removed from a mounting base during a module removal sequence removing a module from the mounting base according to an exemplary embodiment of this disclosure.

With reference to FIG. 15, shown is a flow chart and schematic showing an initial action on a module, and respective position of the module, being removed from a mounting base during a module removal sequence according to an exemplary embodiment of this disclosure.

Initially, (FIG. 15) as the module PCB is initially removed from the mounting base 252 connector, the HP signal 215 loopback connection of 265 is disconnected, while the longer edge pads associated with VCC power 212, TX signal 213, RX signal 214 and ground 211, remain electrically connected to mounting base 252. In response to the disconnection of the HP loopback connection, the module MCU closes the module bypass data switch 210 and stops routing any TX/RX communication data.

Next, (FIG. 16), as the module PCB is further removed from the mounting base 252 connector, (while the longer edge pads associated with VCC power 212, TX signal 213, RX signal 214 and ground 211 remain electrically connected to mounting base 252,) the mounting base 252 normally closed mechanical bypass switch 255, i.e., lower contact of the double contact PCB edge pad connector, closes with the removal of the PCB edge pad from the lower contact, thereby providing a data bypass route from data signals from adjacent modules 101 and 301, while the module normally closed bypass switch 210 continues to also provide a data bypass route from data signals from adjacent modules 101 and 301

Next, (FIG. 17), as the module PCB is further removed from the mounting base 252 connector, (while the longer edge pads associated with VCC power 212 and GND 211 remain electrically connected to mounting base 252,) TX signal 213 and RX 214 signal connections to the mounting base 252 are disconnected, where the mounting base 252 becomes the exclusive routing path for communications from and to adjacent modules. Then, after further removal movement of the module PCB from the mounting base 252, the VCC power 212 and GND 211 electrical connections to the mounting base 252 are disconnected ending the removal of the module 252 from the mounting base 252.

Figure 18:
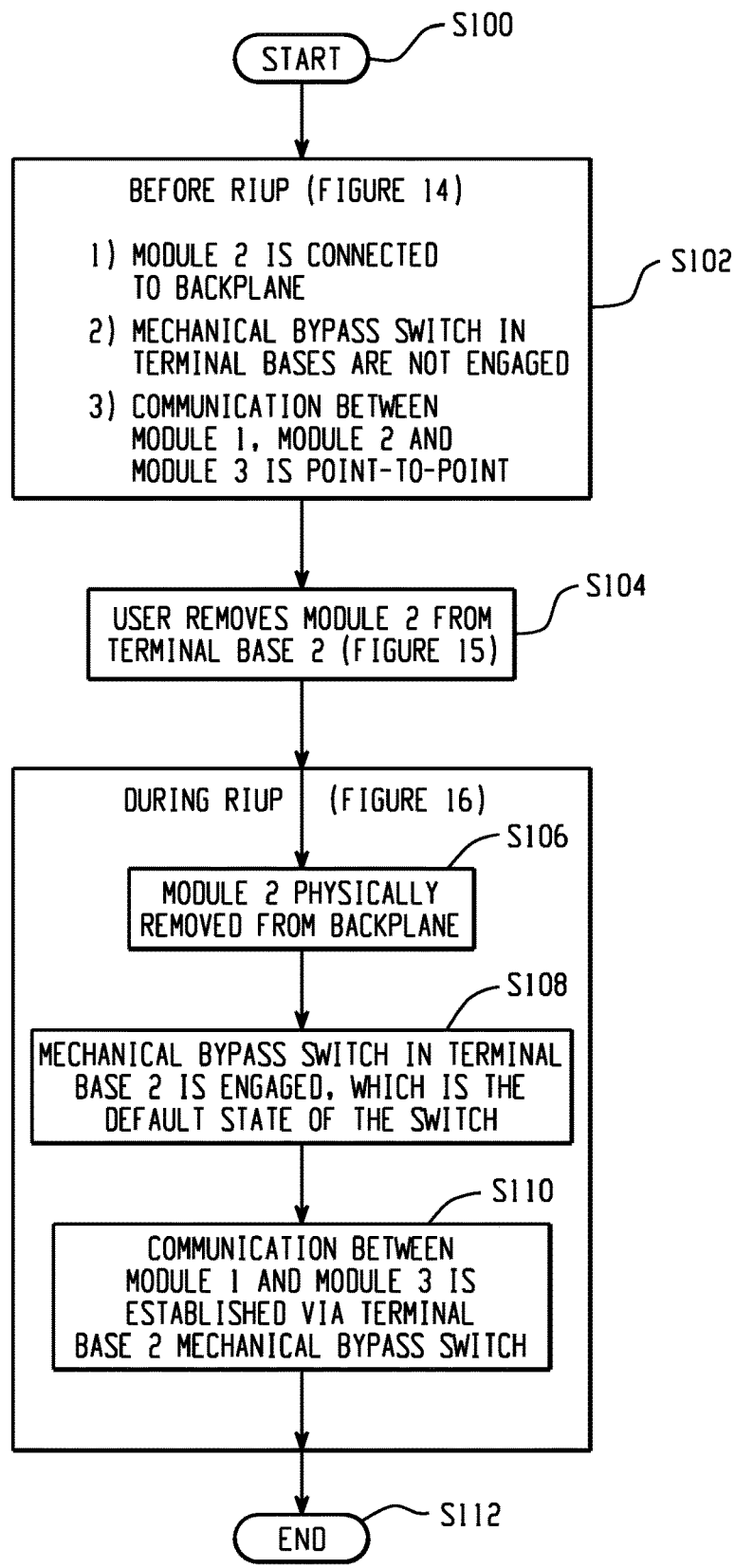
FIG. 18 is a flow chart of a method of executing a point-to-point backplane RIUP operation to remove a module according to an exemplary embodiment of this disclosure.

With reference to FIG. 18, shown is a flow chart of a method of executing a point-to-point backplane RIUP operation to remove a module according to an exemplary embodiment of this disclosure.

The method starts at S100.

Next at step S102, before RIUP (see FIG. 14), 1) Module 2 is connected to backplane; 2) mechanical bypass switch in terminal bases are not engaged; and 3) communication between Module 1, Module 2 and Module 3 is point-to-point.

Then at step S104, the user removes Module 2 from terminal base 2 (see FIG. 15).

Next at step S106, During RIUP (FIG. 16), Module 2 is physically removed from backplane.

Next at step S108, mechanical bypass switch in Terminal Base 2 is engaged which is the default state of Terminal Base 2 bypass switch.

Next at step S110, communication between Module 1 and Module 3 is established via Terminal Base 2 mechanical bypass switch.

Finally, at step S112 the method ends.

Figure 19:
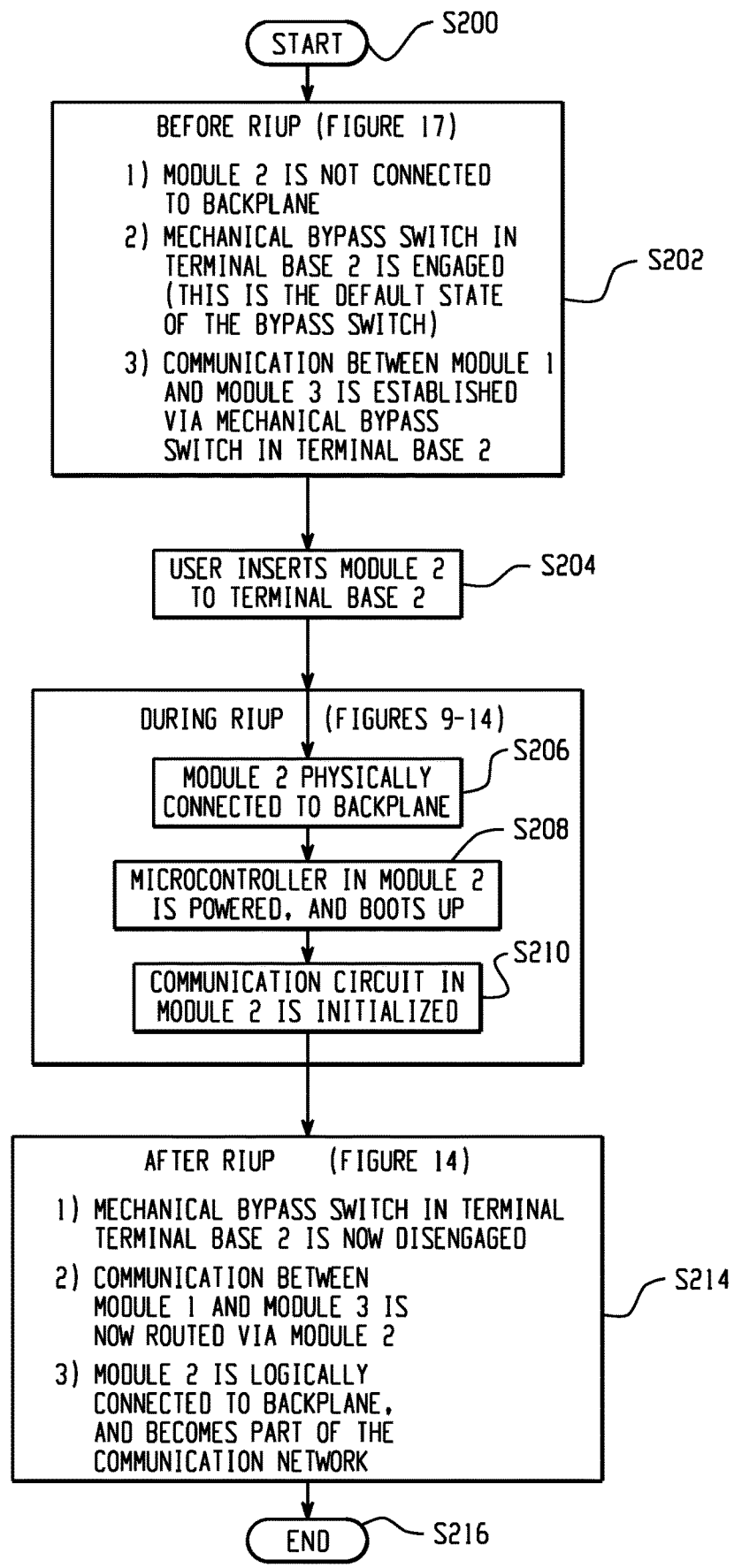
FIG. 19 is a flow chart of a method of executing a point-to-point backplane RIUP operation according to an exemplary embodiment of this disclosure.

With reference to FIG. 19, shown is a flow chart of a method of executing a point-to-point backplane RIUP operation according to an exemplary embodiment of this disclosure.

The method starts at S200.

Next at S202, before RIUP (FIG. 17), 1) Module 2 is not connected to backplane; 2) mechanical bypass switch in Terminal Base 2 is engaged (this is the default state of the bypass switch); and 3) communication between Module 1 and Module 3 is established via mechanical bypass switch in Terminal Base 2.

Then at S204, the user inserts Module 2 to Terminal Base 2.

Next, at S206, during RIUP (FIGS. 9-14), Module 2 is physically connected to backplane.

Then at S208, the microcontroller in Module 2 is powered, and boots up.

Next at S210, communication circuit in Module 2 is initialized.

Next at S214, after RIUP (FIG. 14), 1) the mechanical bypass switch in Terminal Base 2 is now disengaged; 2) communication between Module 1 and Module 3 is now routed via Module 2; and 3) Module 2 is logically connected to backplane, and becomes part of the communication network.

Finally, at step S216, the method ends.

Figure 20:
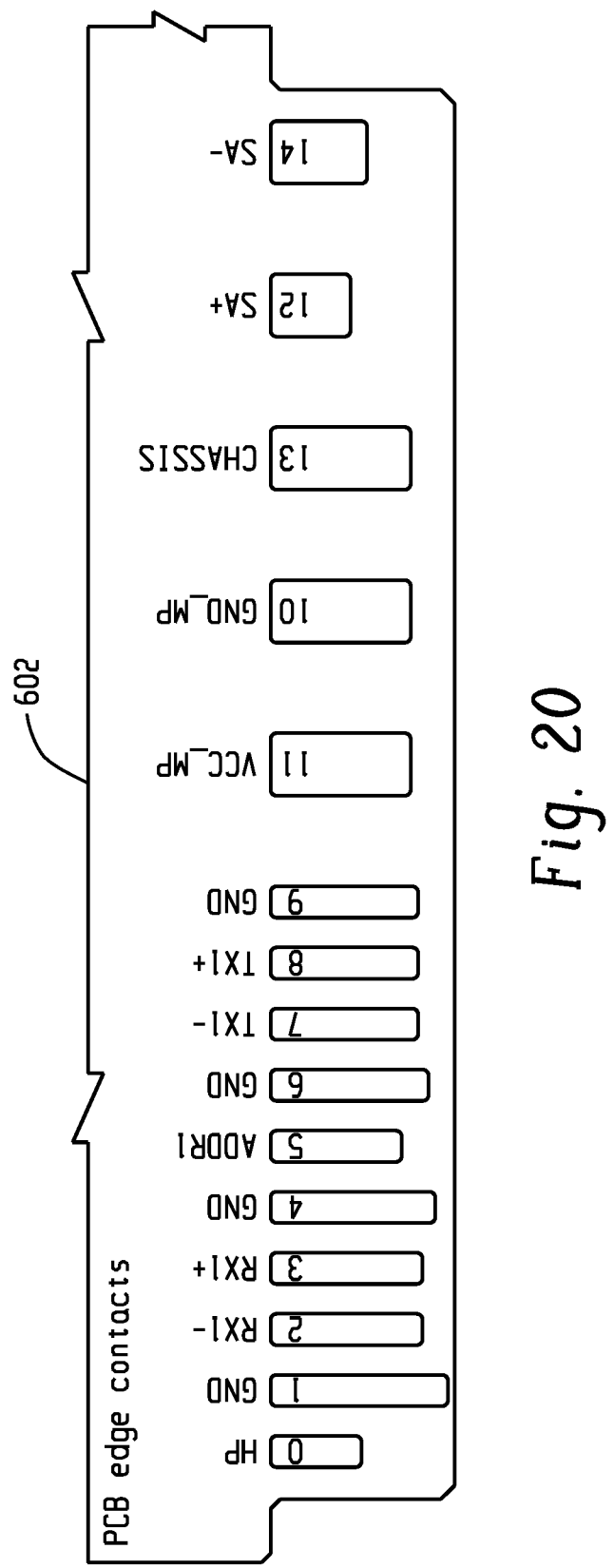
FIG. 20 shows the architecture of an I/O module printed circuit board (PCB) edge connector including edge pads of varying lengths according to an exemplary embodiment of this disclosure.

With reference to FIG. 20, shown is the architecture of an I/O module printed circuit board (PCB) edge connector including edge pads of varying lengths according to another exemplary embodiment of this disclosure. The different lengths of PCB edge pads created a specific timing sequence for the various contact points to engage and disengage, thereby providing a precise sequence to ensure bumpless RIUP. The HP (HotPlug) signal has the shortest length, i.e. this is "the last pair" of mounting base pins.

Figure 21:
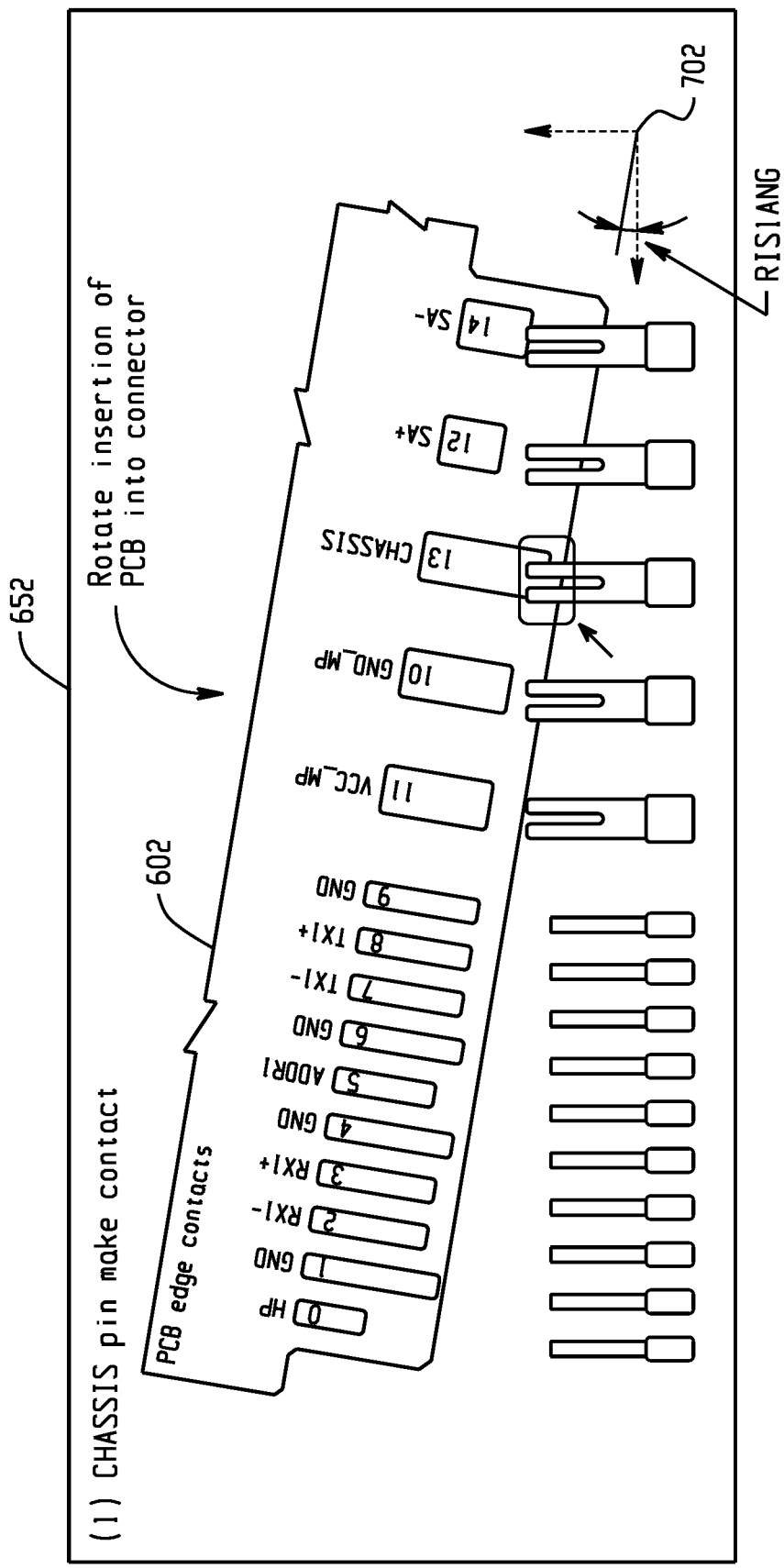
FIG. 21 is a schematic showing an initial action on the I/O module PCB edge connector shown in FIG. 20 inserted into a mounting base during an initial module rotating insertion sequence (RIS1ANG) to insert a module into the mounting base according to an exemplary embodiment of this disclosure, the PCB edge connector and mounting base including a detachable pivot connection which acts an insertion guide.

With reference to FIG. 21, shown is a schematic showing an initial action on the I/O module PCB 602 edge connector shown in FIG. 20 inserted into a mounting base 652 during an initial module rotating insertion sequence (RIS1ANG) to insert a module into the mounting base according to an exemplary embodiment of this disclosure, the PCB edge connector and mounting base including a detachable pivot connection 702 which acts an insertion guide. In the illustration, the PCB is rotated counterclockwise into the mounting base causing the CHASSIS Pin to Make Contact.

Figure 22:
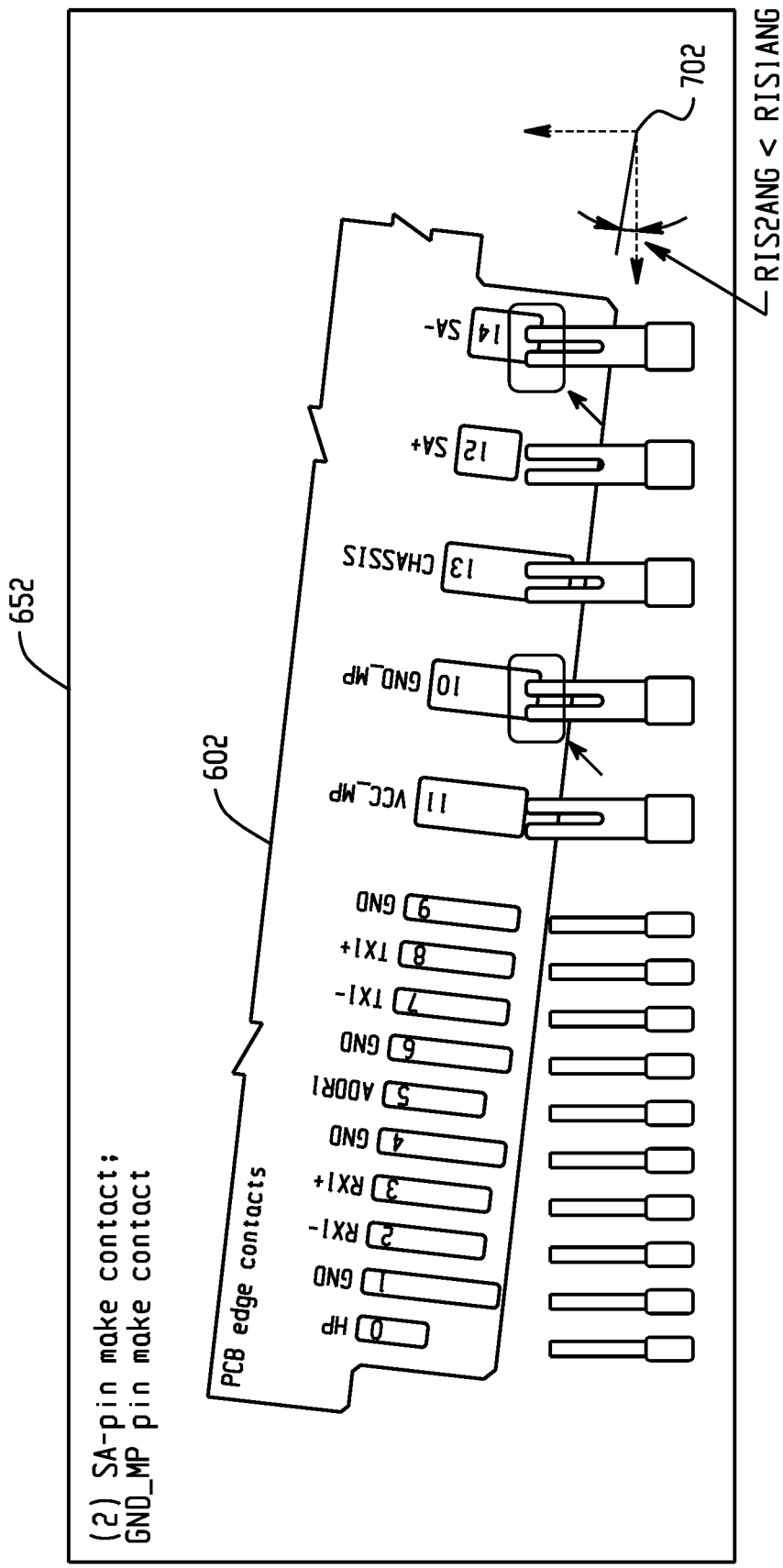
FIG. 22 is a schematic showing a second action on the I/O module PCB edge connector shown in FIG. 21 inserted into a mounting base during a second module rotating insertion sequence (RIS2ANG, where RIS2ANG is less than RIS1ANG) to insert a module into the mounting base according to an exemplary embodiment of this disclosure, the PCB edge connector and mounting base including a detachable pivot connection which acts an insertion guide.

With reference to FIG. 22, shown is a schematic showing a second action on the I/O module 602 PCB edge connector shown in FIG. 21 inserted into a mounting base 652 during a second module rotating insertion sequence (RIS2ANG, where RIS2ANG is less than RIS1ANG) to insert a module into the mounting base, the PCB edge connector and mounting base including a detachable pivot connection 702 which acts an insertion guide. In the illustration, the PCB is further rotated counterclockwise into the mounting base causing SA− and GND MP Pins to Make Contact.

Figure 23:
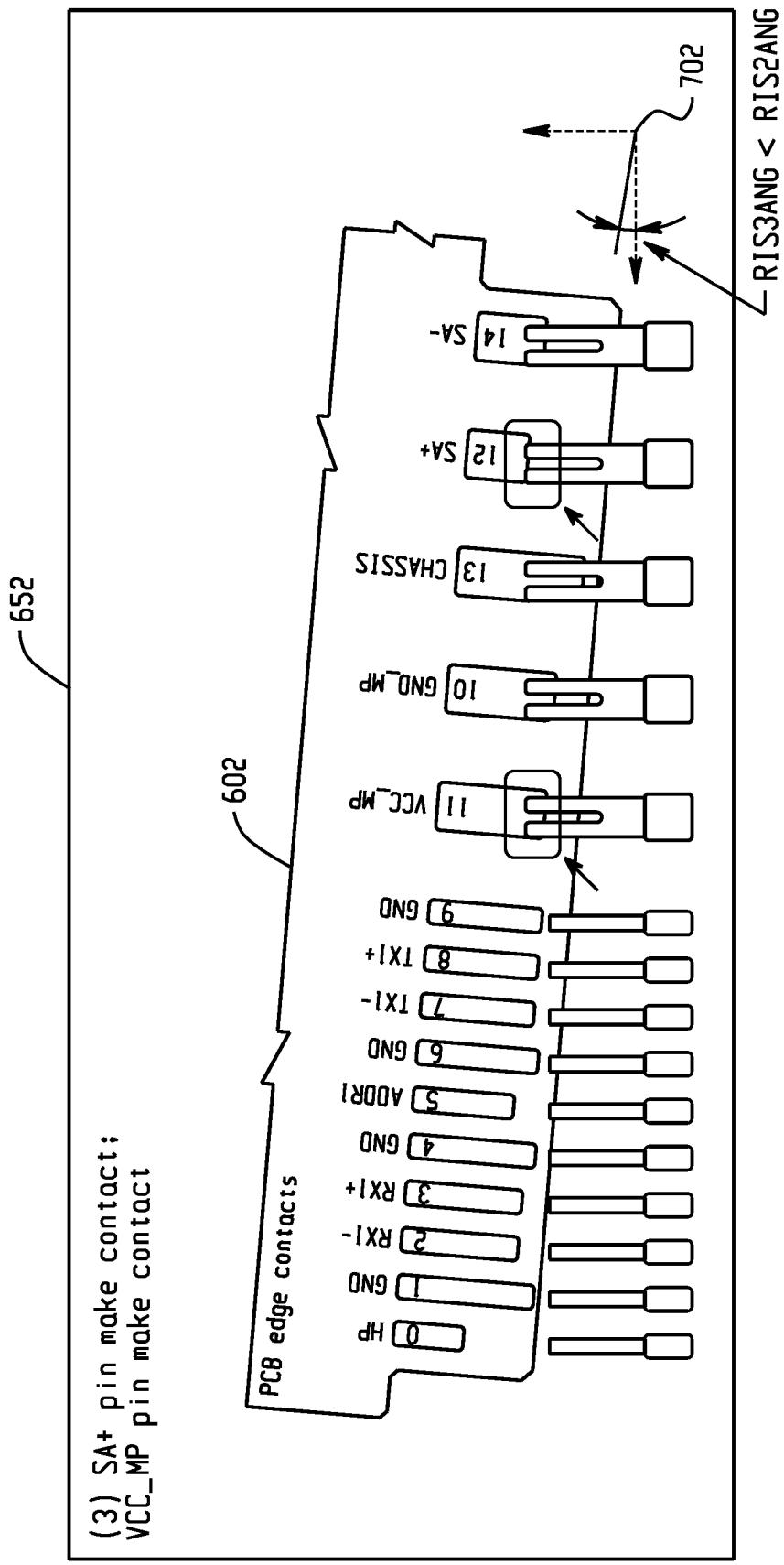
FIG. 23 is a schematic showing a third action on the I/O module PCB edge connector shown in FIG. 22 inserted into a mounting base during a third module rotating insertion sequence (RIS3ANG, where RIS3ANG is less than RIS2ANG) to insert a module into the mounting base according to an exemplary embodiment of this disclosure, the PCB edge connector and mounting base including a detachable pivot connection which acts an insertion guide.

With reference to FIG. 23, shown is a schematic showing a third action on the I/O module 602 PCB edge connector shown in FIG. 22 inserted into a mounting base 652 during a third module rotating insertion sequence (RIS3ANG, where RIS3ANG is less than RIS2ANG) to insert a module into the mounting base. In the illustration, the PCB is further rotated counterclockwise into the mounting base causing SA+ and VCC MP Pins to Make Contact, the detachable pivot connection 702 acting as an insertion guide.

Figure 24:
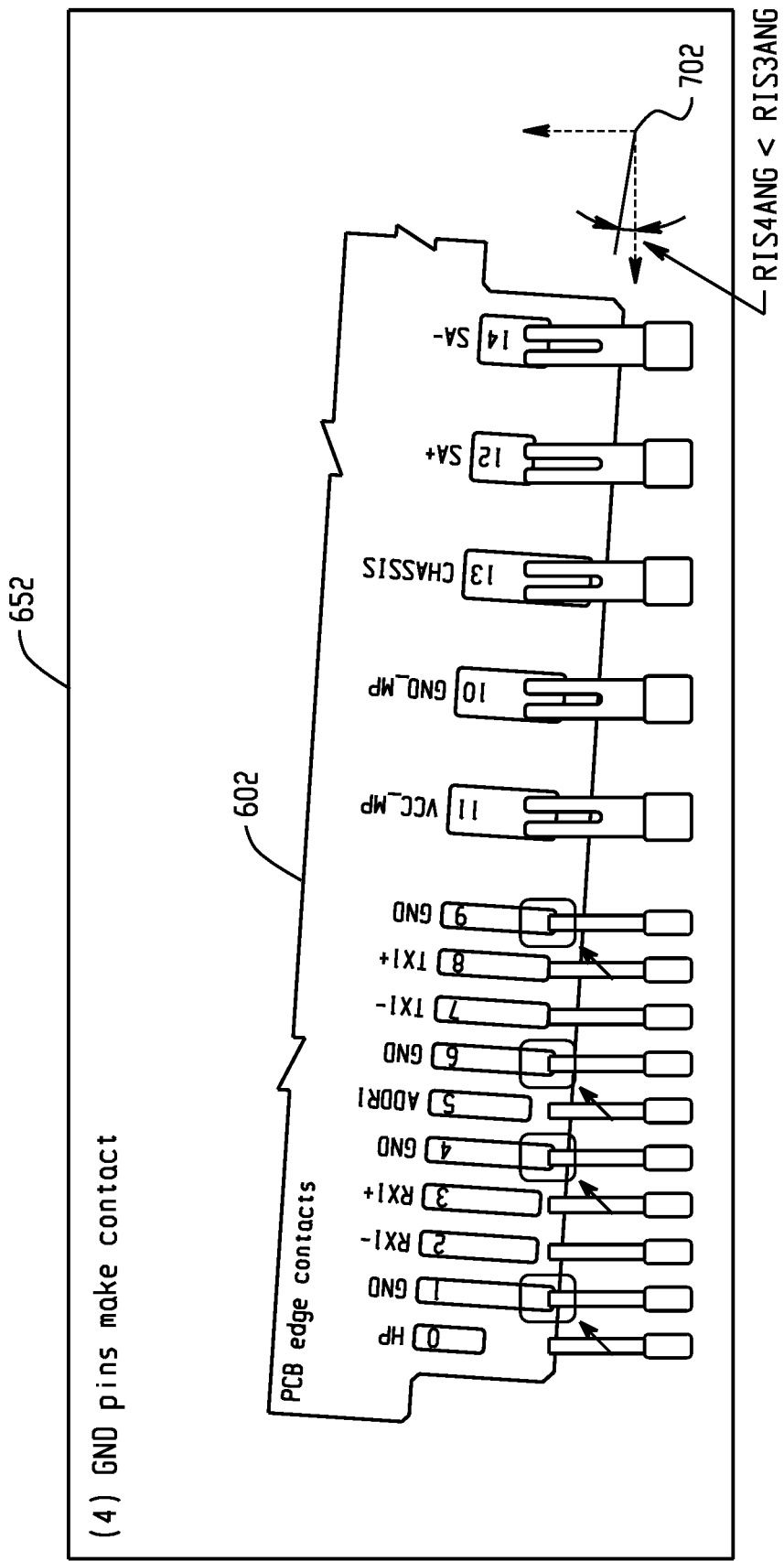
FIG. 24 is a schematic showing a fourth action on the I/O module PCB edge connector shown in FIG. 23 inserted into a mounting base during a fourth module rotating insertion sequence (RIS4ANG, where RIS4ANG is less than RIS3ANG) to insert a module into the mounting base according to an exemplary embodiment of this disclosure, the PCB edge connector and mounting base including a detachable pivot connection which acts an insertion guide.

With reference to FIG. 24, shown is a schematic showing a fourth action on the I/O module 602 PCB edge connector shown in FIG. 23 inserted into a mounting base 652 during a fourth module rotating insertion sequence (RIS4ANG, where RIS4ANG is less than RIS3ANG) to insert a module into the mounting base. In the illustration, the PCB is further rotated counterclockwise into the mounting base causing GND Pins to Make Contact, the detachable pivot connection 702 acting as an insertion guide.

Figure 25:
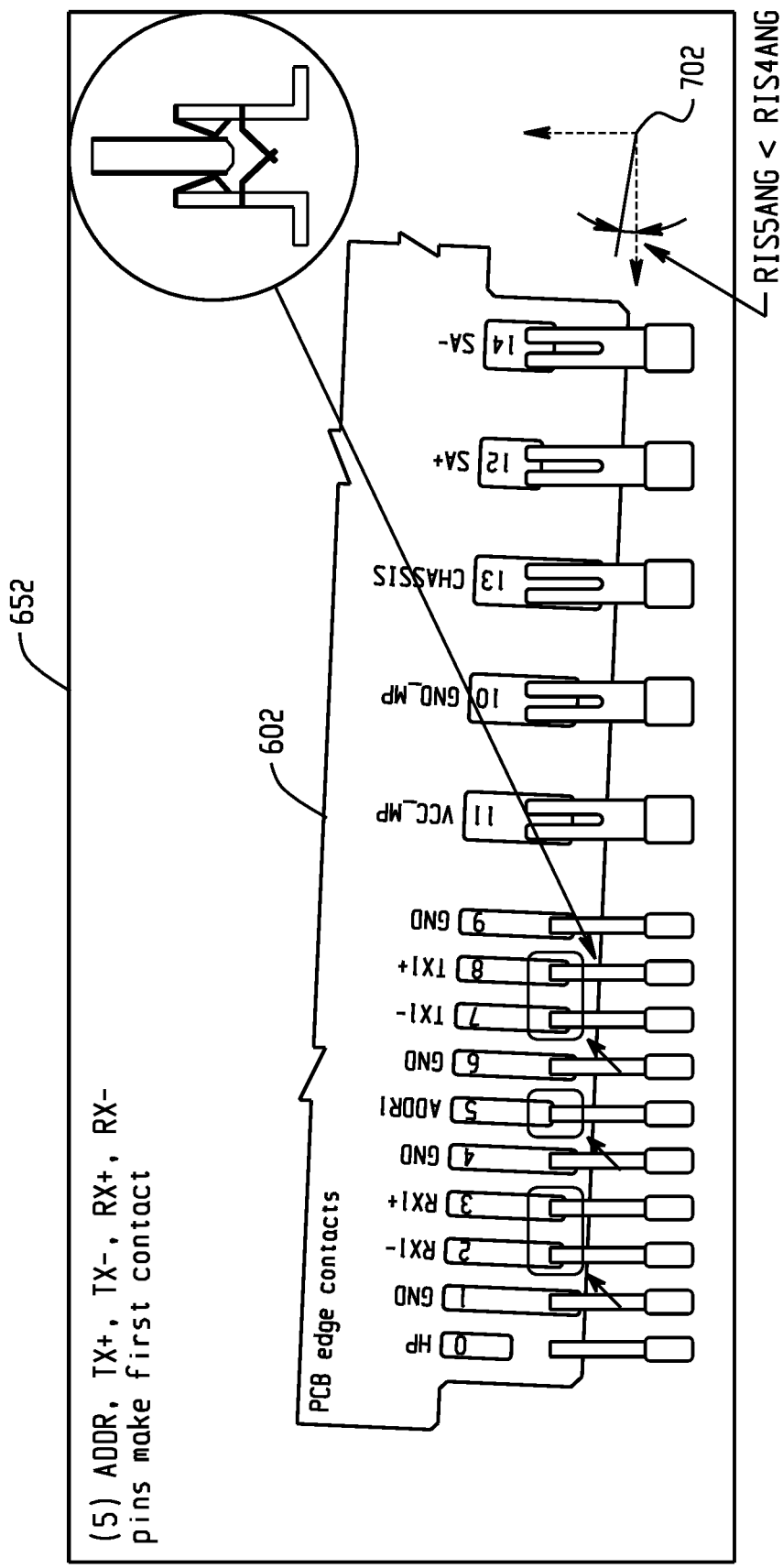
FIG. 25 is a schematic showing a fifth action on the I/O module PCB edge connector shown in FIG. 24 inserted into a mounting base during a fifth module rotating insertion sequence (RIS5ANG, where RIS5ANG is less than RIS4ANG) to insert a module into the mounting base according to an exemplary embodiment of this disclosure, the PCB edge connector and mounting base including a detachable pivot connection which acts an insertion guide.

With reference to FIG. 25, shown is a schematic showing a fifth action on the I/O module 602 PCB edge connector shown in FIG. 24 inserted into a mounting base 652 during a fifth module rotating insertion sequence (RIS5ANG, where RIS5ANG is less than RIS4ANG) to insert a module into the mounting base. In the illustration, the PCB is further rotated counterclockwise into the mounting base causing ADDR, TX+, TX−, RX+ and RX− Pins to Make Contact, the detachable pivot connection 702 acting as an insertion guide.

Figure 26:
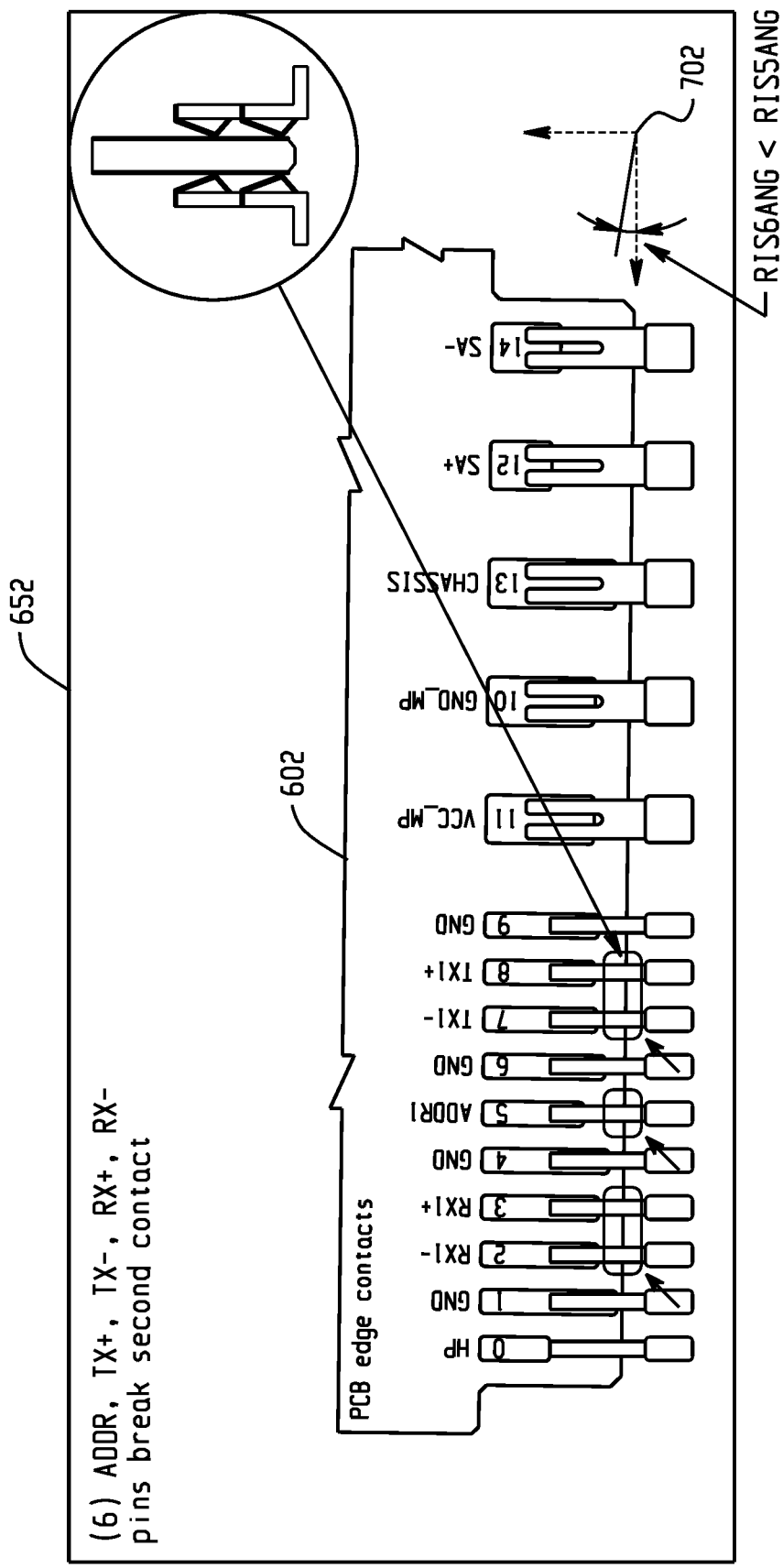
FIG. 26 is a schematic showing a sixth action on the I/O module PCB edge connector shown in FIG. 25 inserted into a mounting base during a sixth module rotating insertion sequence (RIS6ANG, where RIS6ANG is less than RIS5ANG) to insert a module into the mounting base according to an exemplary embodiment of this disclosure, the PCB edge connector and mounting base including a detachable pivot connection which acts an insertion guide.

With reference to FIG. 26, shown is a schematic showing a sixth action on the I/O module 602 PCB edge connector shown in FIG. 25 inserted into a mounting base 652 during a sixth module rotating insertion sequence (RIS6ANG, where RIS6ANG is less than RIS5ANG) to insert a module into the mounting base. In the illustration, the PCB is further rotated counterclockwise into the mounting base causing ADDR, TX+, TX−, RX+ and RX− Pins to Break Contact, the detachable pivot connection 702 acting as an insertion guide.

Figure 27:
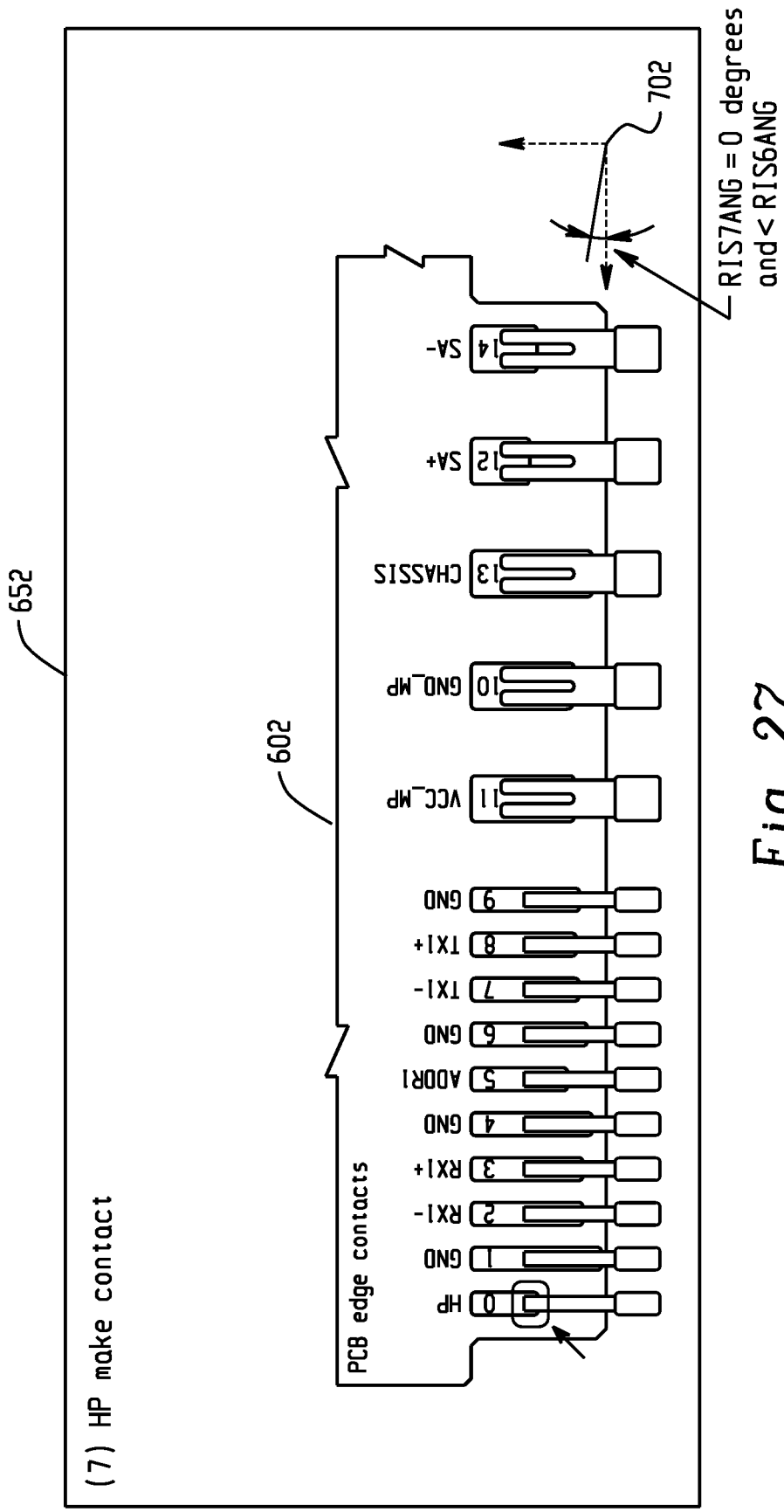
FIG. 27 is a schematic showing a seventh action on the I/O module PCB edge connector shown in FIG. 26 inserted into a mounting base during a seventh module rotating insertion sequence (RIS7ANG, where RIS7ANG is less than RIS6ANG) to insert a module into the mounting base according to an exemplary embodiment of this disclosure, the PCB edge connector and mounting base including a detachable pivot connection which acts an insertion guide.

With reference to FIG. 27, shown is a schematic showing a seventh action on the I/O module 602 PCB edge connector shown in FIG. 26 inserted into a mounting base 652 during a seventh module rotating insertion sequence (RIS7ANG, where RIS7ANG is less than RIS6ANG) to insert a module into the mounting base. In the illustration, the PCB is further rotated counterclockwise into the mounting base causing HP Pins to Make Contact, the detachable pivot connection 702 acting as an insertion guide.

Figure 28:
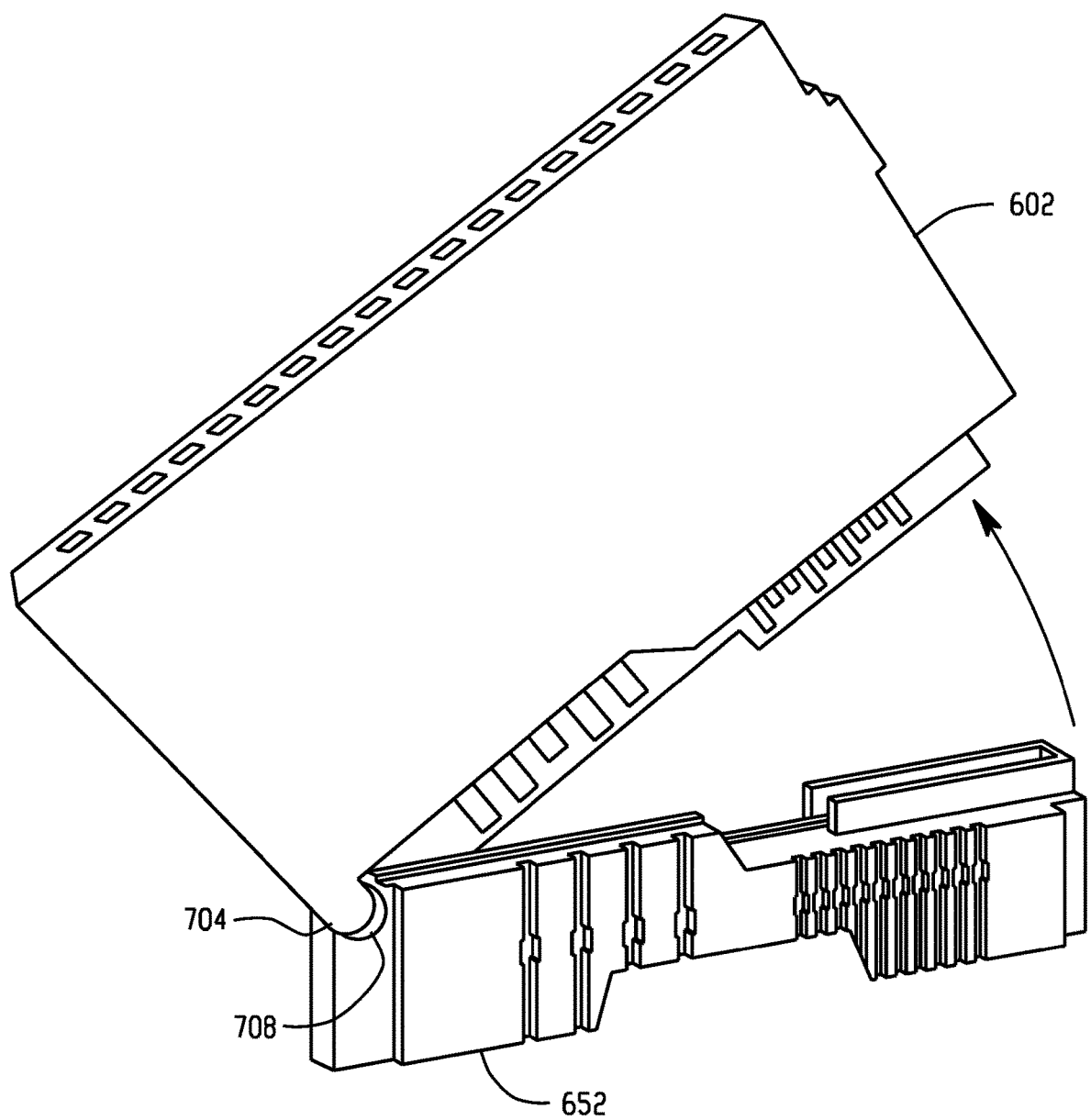
FIG. 28 is an isometric detail view of a module PCB edge connector including edge pads of varying lengths and mounting base connector according to an exemplary embodiment of this disclosure, the PCB edge connector and mounting base including a detachable pivot connection which acts an insertion guide.

With reference to FIG. 28, shown is an isometric detail view of a module PCB edge connector 602 including edge pads of varying lengths and mounting base 652 connector according to an exemplary embodiment of this disclosure, the PCB edge connector and mounting base including a detachable pivot connection (704/706) which acts an insertion guide. As shown, by rotating the I/O module 602 on a pivot against the mounting base 652 and attached mounting base connector, the relative position of the I/O module vs the mounting base is constant, thereby ensuring a mechanically consistent RIUP operation.

Figure 29B:
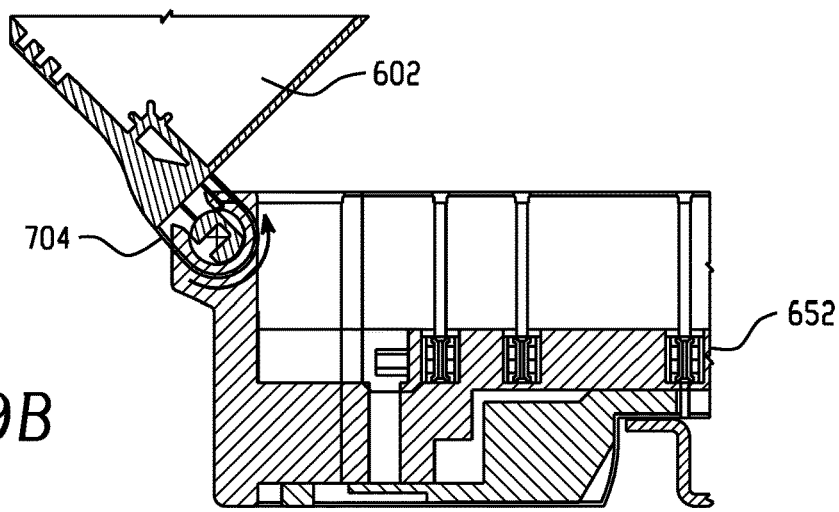
Figure 29C:
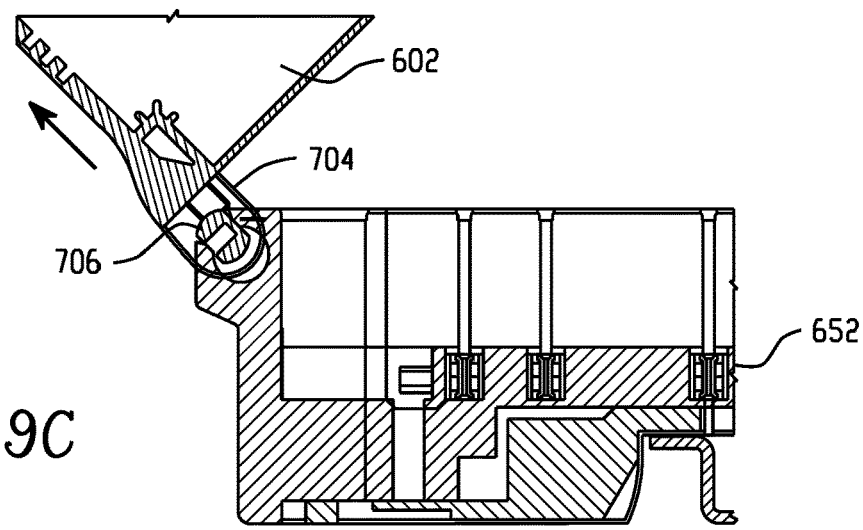
Figure 29D:
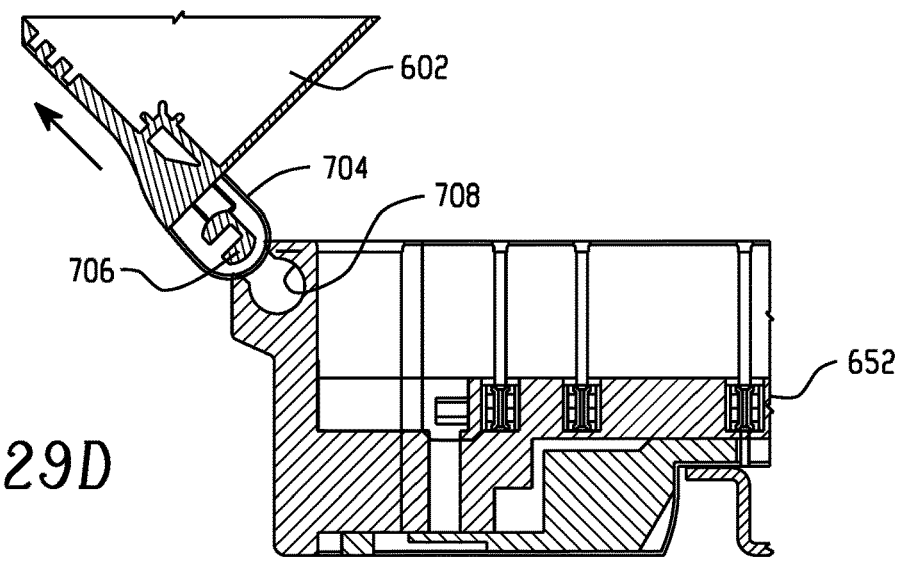
Figure 30A:
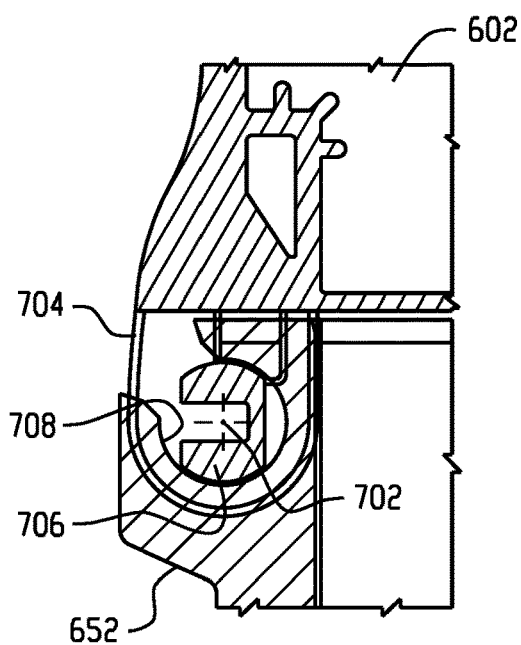
Figure 30B:
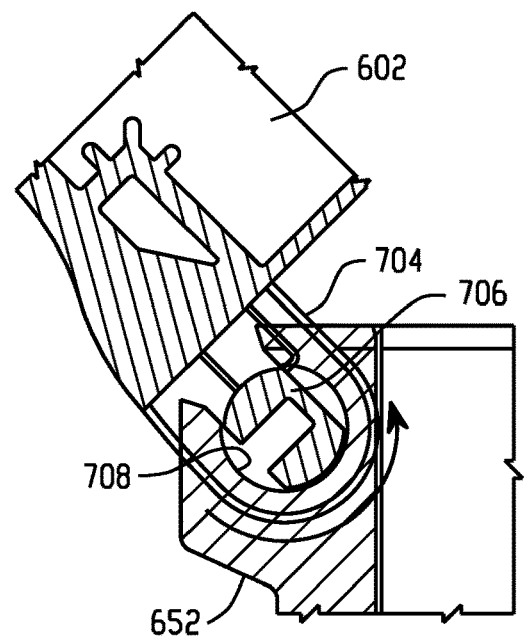
Figure 30C:
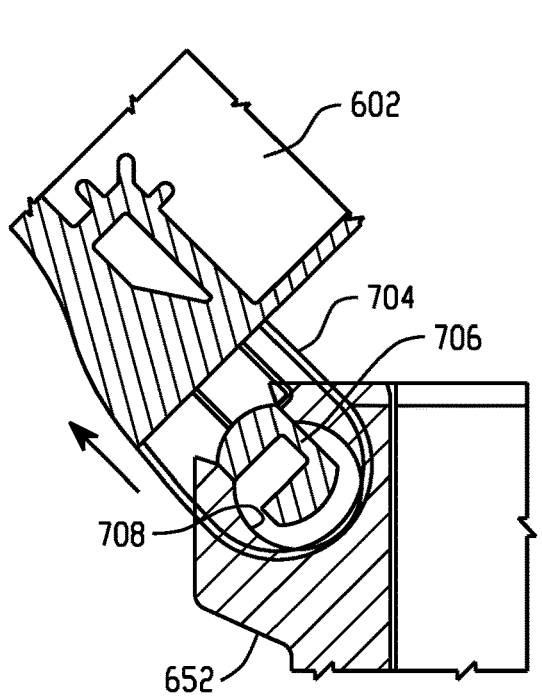
Figure 30D:
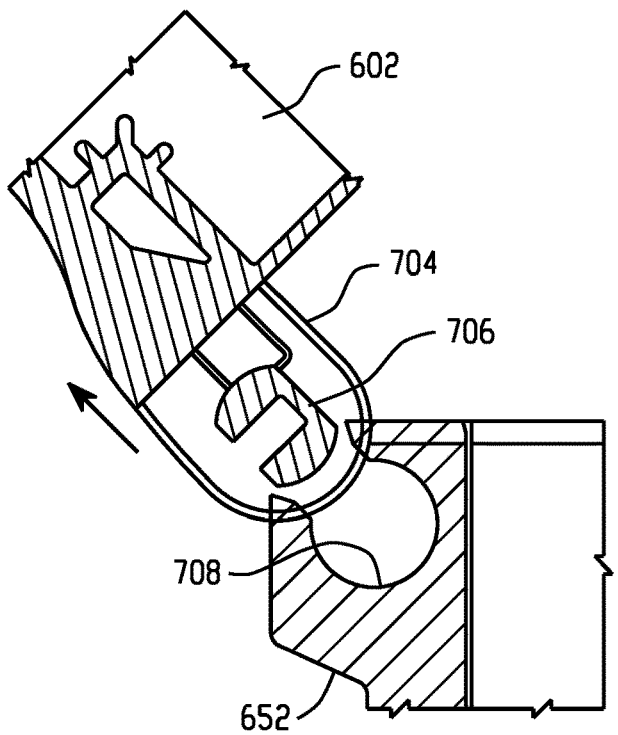

With reference to FIGS. 29 and 30, shown is an I/O module 602 including a PCB edge connector being removed from a mating mounting base 652, according to an exemplary embodiment of this disclosure, (FIGS. 29A and 30A) showing the I/O module and mounting base fully connected, (FIGS. 29B and 30B) showing an initial rotation of the I/O module, (FIGS. 29C and 29C) showing a second position of rotation of the I/O module, and (FIGS. 29D and 30D) showing a disengagement of the I/O module from the mounting base connector via a slotted configuration of the I/O module PCB edge connector.

Disclosed herein are exemplary embodiments including, but not limited to, the following:

[A1] An industrial control device comprising: a plurality of I/O (Input/Output) modules, each I/O module including a microcontroller operatively connected to a first data communication channel, a second data communication channel, a RIUP (Removable and Insertion Under Power) control signal line, and a normally closed I/O module bypass data switch operatively associated with the microcontroller, the bypass data switch including a first switch contact operatively associated with the first data communication channel and a second switch contact operatively associated with the second data communication channel, wherein the first data communication channel, the second data communication channel and the RIUP control signal line terminate on a plurality of respective printed circuit board (PCB) edge pads located near a PCB interface connection edge, and the RIUP control signal PCB edge pad is offset from the PCB interface connection edge a greater distance relative to the first data communication channel and the second data communication channel PCB edge pad offsets from the PCB interface connection edge; and a point-to-point backplane removably coupled to each of the plurality of I/O modules, for each coupled I/O module the backplane including a RIUP control signal line terminating at a contact for connection to the I/O module RIUP control signal PCB edge pad, and a normally closed passive make-before-break bypass data switch operatively associated with the coupled I/O module, the I/O module mechanically opening and closing the passive bypass data switch and the passive bypass data switch including a first switch contact operatively associated with the first data communication channel which also terminates at a first data communication contact for connection to the I/O module first communication channel PCB edge pad and a second switch contact operatively associated with the second data communication channel which also terminates at a second data communication contact for connection to the I/O module second communication channel PCB edge pad, wherein insertion of the I/O module to the backplane causes the following I/O module insertion timing sequence: a) at a first I/O module insertion position, electrical connection of the I/O module first communication channel PCB edge pad to the backplane first communication channel contact, and electrical connection of the I/O module second communication channel PCB edge pad to the backplane second communication channel contact, thereby providing data communication continuity through the I/O module bypass data switch and through the backplane passive make-before-break bypass data switch; b) at a second I/O module insertion position, the second I/O module insertion position closer to the backplane than the first I/O module insertion position, mechanically breaking data communication continuity through the backplane make-before-break bypass data switch while maintaining data communication continuity through the I/O module bypass data switch; c) at a third I/O module insertion position, the third I/O module insertion position closer to the backplane than the first and second I/O module insertion positions, electrical connection of the I/O module RIUP control signal PCB edge pad to the backplane RIUP control signal line terminating contact; and d) the I/O module microcontroller executing an initialization routine which outputs a control signal to the I/O module bypass data switch to open, thereby connecting the backplane first data channel to the respective I/O module first data channel contact exclusive of being routed to the I/O module bypass data switch and connecting the backplane second data channel to the respective I/O module second data channel contact exclusive of being routed through the I/O module bypass data switch, and wherein removal of an I/O module from the backplane causes the following I/O module removal timing sequence: a) at a first I/O module removal position, electrical disconnection of I/O module RIUP control signal PCB edge pad to the backplane RIUP control signal line terminating contact; b) the I/O module microcontroller executing a shutdown routine which outputs a control signal to the I/O module bypass data switch to close, thereby routing the backplane first data channel and second data channel through the I/O module bypass data switch, c) at a second I/O module removal position, the second I/O module removal position further from the backplane than the first I/O module removal position, mechanically establishing data communication continuity through the backplane make-before-break bypass data switch while maintaining data communication continuity through the I/O module bypass data switch; d) at a third I/O module removal position, the third I/O module removal position further from the backplane than the first and second I/O module removal positions, electrical disconnection of the I/O module first communication channel PCB edge pad to the backplane first communication channel contact, and electrical disconnection of the I/O module second communication channel PCB edge pad to the backplane second communication channel contact.

[A2] The industrial control device according to paragraph [A1], wherein each of the plurality of I/O modules include a first data transceiver operatively associated with the first data communication channel and a second data transceiver operatively associated with the second data communication channel.

[A3] The industrial control device according to paragraph [A1], wherein the I/O module bypass data switch is one of a solid state device and an electrical relay device.

[A4] The industrial control device according to paragraph [A1], further comprising: a data communications module adapter operatively connected to the backplane and operatively connected to communicate with all inserted I/O modules.

[A5] The industrial control device according to paragraph [A1], wherein the first data communication channel and the second data communication channel are Ethernet based.

[A6] The industrial control device according to paragraph [A1], wherein the backplane includes a plurality of mounting bases, each mounting base operatively associated with a respective I/O module.

[A7] The industrial control device according to paragraph [A1], wherein the plurality of mounting bases are passive mounting bases.

[A8] The industrial control device according to paragraph [A1], wherein the backplane includes a plurality of backplane modules operatively connected to provide the backplane, each backplane module including one or more mounting bases.

[A9] The industrial control device according to paragraph [A1], wherein the printed circuit edge pads vary in length to provide the I/O module insertion timing sequence and I/O module removal timing sequence.

[A10] The industrial control device according to paragraph [A1], wherein the I/O module first communication channel PCB edge pads are located on a first side of the PCB and the second communication channel PCB edge pads are located on an opposite second side of the PCB, and the first communication channel PCB edge pads and second communication channel PCB edge pads are of equivalent length and aligned parallel to each other.

[A11] The industrial control device according to paragraph [A1], wherein the PCB interface connection edge is a straight edge orthogonal to the longitudinal axis of the plurality of respective printed circuit board (PCB) edge pads.

[A12] The industrial control device according to paragraph [A1], wherein the I/O module first communication channel PCB edge pads are located on a first side of the PCB and the second communication channel PCB edge pads are located on an opposite second side of the PCB, the first communication channel PCB edge pads and second communication channel PCB edge pads are of equivalent length and aligned parallel to each other, and the normally closed passive make-before-break bypass data switch is a normally closed double contact switch with a top set of contacts and a bottom set of normally closed contacts to function as a make-before-break bypass data switch as the first communication channel PCB edge pads and the second communication channel PCB edge pads are inserted into the normally closed double contact switch.

[A13] The industrial control device according to paragraph [A1], wherein the RIUP control signal PCB edge pad includes an edge pad located on a first side of the PCB and a second edge pad located on an opposite second side of the PCB, and the first RIUP control signal PCB edge pads are of equivalent length and aligned parallel to each other, and the backplane includes a single contact terminal to provide a loopback signal to the microcontroller after the RIUP control signal PCB edge pads are inserted into the single contact terminal.

[A14] The industrial control device according to paragraph [A1], wherein the I/O module and backplane includes a power and chassis ground interface.

[A15] The industrial control device according to paragraph [A14], wherein the power and ground interface includes a plurality of respective printed circuit board (PCB) edge pads located near the PCB interface connection edge, and the plurality of respective printed circuit board (PCB) edge pads are offset from the PCB interface connection edge a lesser distance relative to the first data communication channel and the second data communication channel PCB edge pad offsets from the PCB interface connection edge.

[A16] The industrial control device according to paragraph [A1], wherein the backplane provides power to the I/O module as the I/O module is inserted into the backplane and prior to the first communication channel, second communication channel and RIUP control signal being electrically connected to the backplane.

[A17] The industrial control device according to paragraph [A1], wherein the I/O module includes an insertion and removal guide which removably couples to the backplane to provide an alignment of the plurality of PCB edge pads when inserted or removed from the backplane, and to assist in maintaining the I/O module insertion timing sequence and I/O module removal timing sequence.

[A18] The industrial control device according to paragraph [A17], wherein the insertion and removal guide includes a pivot connection of the I/O module to the backplane, and the I/O module is inserted and removed from the backplane with a rotating motion of the I/O module.

[A19] The industrial control device according to paragraph [A1], wherein the I/O module first communication channel PCB edge pads are located on a first side of the PCB and the second communication channel PCB edge pads are located on an opposite second side of the PCB, the first communication channel PCB edge pads and second communication channel PCB edge pads are of equivalent length and aligned parallel to each other, and the normally closed passive make-before-break bypass data switch is a normally closed double contact switch with a top set of contacts and a bottom set of normally closed contacts to function as a make-before-break bypass data switch as the first communication channel PCB edge pads and the second communication channel PCB edge pads are inserted into the normally closed double contact switch, and wherein the RIUP control signal PCB edge pad includes an edge pad located on a first side of the PCB and a second edge pad located on an opposite second side of the PCB, and the first RIUP control signal PCB edge pads are of equivalent length and aligned parallel to each other, and the backplane includes a single contact terminal to provide a loopback signal to the microcontroller after the RIUP control signal PCB edge pads are inserted into the single contact terminal.

[A20] The industrial control device according to paragraph [A1], wherein the I/O module and backplane includes a power and chassis ground interface, and wherein the power and ground interface includes a plurality of respective printed circuit board (PCB) edge pads located near the PCB interface connection edge, and the plurality of respective printed circuit board (PCB) edge pads are offset from the PCB interface connection edge a lesser distance relative to the first data communication channel and the second data communication channel PCB edge pad offsets from the PCB interface connection edge.

[B1] A control module for an industrial device, the control module comprising: a microcontroller operatively connected to a first data communication channel, a second data communication and a RIUP (Removable and Insertion Under Power) control signal line, and a normally closed control module bypass data switch operatively associated with the microcontroller to open and close the control module bypass data switch and each bypass data switch including a first switch contact operatively associated with the first data communication channel and a second switch contact associated with the second data communication channel, wherein the first data communication channel, the second data communication channel and the RIUP control signal line terminate on a plurality of respective printed circuit board (PCB) edge pads located near a PCB connection edge, the RIUP control signal line PCB edge pad offset from the PCB connection edge a greater distance relative to the first data communication channel and the second data communication channel PCB edge pad offsets from the PCB connection edge, wherein the plurality of respective printed circuit board (PCB) edge pads interface the first data communication channel, the second communication channel and the control signal line to an associated mounting base, the associated mounting base including a normally closed passive make-before-break bypass data switch which an insertion and removal of the control module from the mounting base mechanically opens and closes, respectively, the passive bypass data switch the passive bypass data switch including a first switch contact operatively associated with the first data communication channel which also terminates at a first data communication contact for connection to the first communication channel PCB edge pad and a second switch contact operatively associated with the second data communication channel which also terminates at a second data communication contact for connection to the second communication channel PCB edge pad, wherein the microcontroller is configured to execute instructions to control the control module bypass data switch, the control module bypass data switch operating in a first state to provide point-to-point data communications between two other control modules adjacent to the control module as the control module is removed from the associated mounting base, and a second state to provide point-to-point data communications between the control module and the two other control modules adjacent the control module after the control module is inserted to the mounting base.

[B2] The control module for an industrial device according to paragraph [B1], wherein the control module is configured to execute an initialization routine after insertion of the control module to the associated mounting base and the control module is configured to control the control module bypass data switch, via the control signal line, to switch to the second state after the execution of the initialization routine.

[B3] The control module for an industrial device according to paragraph [B2], wherein the first communication channel includes a first data transceiver and the second communication channel includes a second data transceiver.

[B4] The control module for an industrial device according to paragraph [B1], wherein the first data channel and the second data channel are Ethernet based.

[B5] The control module for an industrial device according to paragraph [B1], wherein the associated mounting base is a passive mounting base.

[B6] The control module for an industrial device according to paragraph [B1], wherein the printed circuit edge pads vary in length to provide the I/O module insertion timing sequence and I/O module removal timing sequence.

[B7] The control module for an industrial device according to paragraph [B1], wherein the I/O module first communication channel PCB edge pads are located on a first side of the PCB and the second communication channel PCB edge pads are located on an opposite second side of the PCB, and the first communication channel PCB edge pads and second communication channel PCB edge pads are of equivalent length and aligned parallel to each other.

[B8] The control module for an industrial device according to paragraph [B1], wherein the PCB interface connection edge is a straight edge orthogonal to the longitudinal axis of the plurality of respective printed circuit board (PCB) edge pads.

[B9] The control module for an industrial device according to paragraph [B1], wherein the I/O module first communication channel PCB edge pads are located on a first side of the PCB and the second communication channel PCB edge pads are located on an opposite second side of the PCB, the first communication channel PCB edge pads and second communication channel PCB edge pads are of equivalent length and aligned parallel to each other, and the associated backplane normally closed passive make-before-break bypass data switch is a normally closed double contact switch with a top set of contacts and a bottom set of normally closed contacts to function as a make-before-break bypass data switch as the first communication channel PCB edge pads and the second communication channel PCB edge pads are inserted into the normally closed double contact switch.

[B10] The control module for an industrial device according to paragraph [B1], wherein the RIUP control signal PCB edge pad includes an edge pad located on a first side of the PCB and a second edge pad located on an opposite second side of the PCB, and the first RIUP control signal PCB edge pads are of equivalent length and aligned parallel to each other, and the associated backplane includes a single contact terminal to provide a loopback signal to the microcontroller after the RIUP control signal PCB edge pads are inserted into the single contact terminal.

[B11] The control module for an industrial device according to paragraph [B1], wherein the I/O module and the associated backplane includes a power and chassis ground interface.

[B12] The control module for an industrial device according to paragraph [B1], wherein the power and ground interface includes a plurality of respective printed circuit board (PCB) edge pads located near the PCB interface connection edge, and the plurality of respective printed circuit board (PCB) edge pads are offset from the PCB interface connection edge a lesser distance relative to the first data communication channel and the second data communication channel PCB edge pad offsets from the PCB interface connection edge.

[B13] The control module for an industrial device according to paragraph [B1], wherein the associated backplane provides power to the I/O module as the I/O module is inserted into the associated backplane and prior to the first communication channel, second communication channel and RIUP control signal being electrically connected to the associated backplane.

[B14] The control module for an industrial device according to paragraph [B1], wherein the I/O module includes an insertion and removal guide which removably couples to the associated backplane to provide an alignment of the plurality of PCB edge pads when inserted or removed from the associated backplane, and to assist in maintaining the I/O module insertion timing sequence and I/O module removal timing sequence.

[B15] The control module for an industrial device according to paragraph [B1], wherein the insertion and removal guide includes a pivot connection of the I/O module to the associated backplane, and the I/O module is inserted and removed from the associated backplane with a rotating motion of the I/O module.

[B16] The control module for an industrial device according to paragraph [B1], wherein the I/O module first communication channel PCB edge pads are located on a first side of the PCB and the second communication channel PCB edge pads are located on an opposite second side of the PCB, the first communication channel PCB edge pads and second communication channel PCB edge pads are of equivalent length and aligned parallel to each other, and the normally closed passive make-before-break bypass data switch is a normally closed double contact switch with a top set of contacts and a bottom set of normally closed contacts to function as a make-before-break bypass data switch as the first communication channel PCB edge pads and the second communication channel PCB edge pads are inserted into the normally closed double contact switch, and wherein the RIUP control signal PCB edge pad includes an edge pad located on a first side of the PCB and a second edge pad located on an opposite second side of the PCB, and the first RIUP control signal PCB edge pads are of equivalent length and aligned parallel to each other, and the backplane includes a single contact terminal to provide a loopback signal to the microcontroller after the RIUP control signal PCB edge pads are inserted into the single contact terminal.

[B17] The control module for an industrial device according to paragraph [B1], wherein the I/O module and the associated backplane include a power and chassis ground interface, and wherein the power and ground interface includes a plurality of respective printed circuit board (PCB) edge pads located near the PCB interface connection edge, and the plurality of respective printed circuit board (PCB) edge pads are offset from the PCB interface connection edge a lesser distance relative to the first data communication channel and the second data communication channel PCB edge pad offsets from the PCB interface connection edge.

[C1] A point-to-point backplane for an industrial control device comprising: a plurality of mounting bases configured to removably couple a plurality of respective I/O (Input/Output) modules, each mounting base including a passive bypass data switch operatively associated with a respective I/O module which an insertion and removal of the I/O module from the mounting base mechanically opens and closes, respectively, the passive bypass data switch, the passive bypass data switch including a first switch contact operatively associated with a first data communication channel which also terminates at a first data communication contact for connection to an I/O module first communication channel PCB edge pad and a second switch contact operatively associated with the second data communication channel which also terminates at a second data communication contact for connection to an I/O module second communication channel PCB edge pad.

[C2] 39. The point-to-point backplane for an industrial control device according to paragraph [C1], wherein the plurality of mounting bases are passive mounting bases.

[C3] The point-to-point backplane for an industrial control device according to paragraph [C1], wherein the first data communication channel and the second data communication channel are Ethernet based.

[C4] The point-to-point backplane for an industrial control device according to paragraph [C1], wherein the first data communication channel includes a first data transceiver and the second data communication channel includes a second data transceiver.

[C5] The point-to-point backplane for an industrial control device according to paragraph [C1], wherein the backplane includes a plurality of backplane modules operatively connected to provide the point-to-point backplane, each backplane module including one or more of the plurality of mounting bases.

[C6] The point-to-point backplane for an industrial control device according to paragraph [C1], wherein the passive bypass data switch is a make-before-break double contact connector adapted to accept PCB edge pads operatively connected to a control module.

[C7] The point-to-point backplane for an industrial control device according to paragraph [C1], wherein the backplane is configured to operatively connect a data communications module which communicates with the plurality of respective I/O modules.

[C8] The point-to-point backplane for an industrial control device according to paragraph [C1], wherein the printed circuit edge pads vary in length to provide an I/O module insertion timing sequence and an I/O module removal timing sequence.

[C9] The point-to-point backplane for an industrial control device according to paragraph [C1], wherein the I/O module first communication channel PCB edge pads are located on a first side of the PCB and the second communication channel PCB edge pads are located on an opposite second side of an I/O module PCB, and the first communication channel PCB edge pads and second communication channel PCB edge pads are of equivalent length and aligned parallel to each other.

[C10] The point-to-point backplane for an industrial control device according to paragraph [C1], wherein the I/O module first communication channel PCB edge pads are located on a first side of the PCB and the second communication channel PCB edge pads are located on an opposite second side of the PCB, the first communication channel PCB edge pads and second communication channel PCB edge pads are of equivalent length and aligned parallel to each other, and the normally closed passive make-before-break bypass data switch is a normally closed double contact switch with a top set of contacts and a bottom set of normally closed contacts to function as a make-before-break bypass data switch as the first communication channel PCB edge pads and the second communication channel PCB edge pads are inserted into the normally closed double contact switch.

[C11] The point-to-point backplane for an industrial control device according to paragraph [C1], wherein the I/O module includes a RIUP control signal PCB edge pad located on a first side of the PCB and a second edge pad located on an opposite second side of the PCB, and the first RIUP control signal PCB edge pads are of equivalent length and aligned parallel to each other, and the mounting base includes a single contact terminal to provide a loopback signal to the I/O module after the RIUP control signal PCB edge pads are inserted into the single contact terminal.

[C12] The point-to-point backplane for an industrial control device according to paragraph [C1], wherein the I/O module and backplane includes a power and chassis ground interface.

[C13] The point-to-point backplane for an industrial control device according to paragraph [C12], wherein the power and ground interface includes a plurality of respective printed circuit board (PCB) edge pads located near a PCB interface connection edge, and the plurality of respective printed circuit board (PCB) edge pads are offset from the PCB interface connection edge a lesser distance relative a first data communication channel and a second data communication channel PCB edge pad offset from the PCB interface connection edge.

[C14] The point-to-point backplane for an industrial control device according to paragraph [C1], wherein the backplane provides power to the I/O module as the I/O module is inserted into the backplane and prior to the first communication channel and second communication channel being electrically connected to the backplane.

[C15] The point-to-point backplane for an industrial control device according to paragraph [C1], wherein the I/O module includes an insertion and removal guide which removably couples to the backplane to provide an alignment of the PCB edge pads when inserted or removed from the backplane, and to assist in maintaining the I/O module insertion timing sequence and I/O module removal timing sequence.

[C16] The industrial control device according to paragraph [C1], wherein the insertion and removal guide includes a pivot connection of the I/O module to the backplane, and the I/O module is inserted and removed from the backplane with a rotating motion of the I/O module.

Some portions of the detailed description herein are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems is apparent from the description above. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

The methods illustrated throughout the specification, may be implemented in a computer program product that may be executed on a computer. The computer program product may comprise a non-transitory computer-readable recording medium on which a control program is recorded, such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

In the preceding specification, various embodiments have been described with reference to the accompanying drawings. It will, however, be evident that various modifications and changes may be made thereto, and additional embodiments may be implemented, without departing from the broader scope of this disclosure as set forth in the claims that follow. The specification and drawings are accordingly to be regarded in an illustrative rather than restrictive sense.

The following is claimed:

1. A control module for an industrial device, the control module comprising:
a microcontroller operatively connected to a first data communication channel, a second data communication and a RIUP (Removable and Insertion Under Power) control signal line, and a normally closed control module bypass data switch operatively associated with the microcontroller to open and close the control module bypass data switch and each bypass data switch including a first switch contact operatively associated with the first data communication channel and a second switch contact associated with the second data communication channel, wherein the first data communication channel, the second data communication channel and the RIUP control signal line terminate on a plurality of respective printed circuit board (PCB) edge pads located near a PCB connection edge, the RIUP control signal line PCB edge pad offset from the PCB connection edge a greater distance relative to the first data communication channel and the second data communication channel PCB edge pad offsets from the PCB connection edge, wherein the plurality of respective printed circuit board (PCB) edge pads interface the first data communication channel, the second communication channel and the control signal line to an associated mounting base, the associated mounting base including a normally closed passive make-before-break bypass data switch which an insertion and removal of the control module from the mounting base mechanically opens and closes, respectively, the passive bypass data switch the passive bypass data switch including a first switch contact operatively associated with the first data communication channel which also terminates at a first data communication contact for connection to the first communication channel PCB edge pad and a second switch contact operatively associated with the second data communication channel which also terminates at a second data communication contact for connection to the second communication channel PCB edge pad,
wherein the microcontroller is configured to execute instructions to control the control module bypass data switch, the control module bypass data switch operating in a first state to provide point-to-point data communications between two other control modules adjacent to the control module as the control module is removed from the associated mounting base, and a second state to provide point-to-point data communications between the control module and the two other control modules adjacent the control module after the control module is inserted to the mounting base.

2. The control module for an industrial device according to claim 1, wherein the control module is configured to execute an initialization routine after insertion of the control module to the associated mounting base and the control module is configured to control the control module bypass data switch, via the control signal line, to switch to the second state after the execution of the initialization routine.

3. The control module for an industrial device according to claim 1, wherein the printed circuit edge pads vary in length to provide the I/O module insertion timing sequence and I/O module removal timing sequence.

4. The control module for an industrial device according to claim 1, wherein the I/O module first communication channel PCB edge pads are located on a first side of the PCB and the second communication channel PCB edge pads are located on an opposite second side of the PCB, and the first communication channel PCB edge pads and second communication channel PCB edge pads are of equivalent length and aligned parallel to each other.

5. The control module for an industrial device according to claim 1, wherein the I/O module first communication channel PCB edge pads are located on a first side of the PCB and the second communication channel PCB edge pads are located on an opposite second side of the PCB, the first communication channel PCB edge pads and second communication channel PCB edge pads are of equivalent length and aligned parallel to each other, and the associated backplane normally closed passive make-before-break bypass data switch is a normally closed double contact switch with a top set of contacts and a bottom set of normally closed contacts to function as a make-before-break bypass data switch as the first communication channel PCB edge pads and the second communication channel PCB edge pads are inserted into the normally closed double contact switch.

6. The control module for an industrial device according to claim 1, wherein the RIUP control signal PCB edge pad includes an edge pad located on a first side of the PCB and a second edge pad located on an opposite second side of the PCB, and the first RIUP control signal PCB edge pads are of equivalent length and aligned parallel to each other, and the associated backplane includes a single contact terminal to provide a loopback signal to the microcontroller after the RIUP control signal PCB edge pads are inserted into the single contact terminal.

7. The control module for an industrial device according to claim 1, wherein the I/O module and the associated backplane includes a power and chassis ground interface.

8. The control module for an industrial device according to claim 7, wherein the power and ground interface includes a plurality of respective printed circuit board (PCB) edge pads located near the PCB interface connection edge, and the plurality of respective printed circuit board (PCB) edge pads are offset from the PCB interface connection edge a lesser distance relative to the first data communication channel and the second data communication channel PCB edge pad offsets from the PCB interface connection edge.

9. The control module for an industrial device according to claim 1, wherein the I/O module includes an insertion and removal guide which removably couples to the associated backplane to provide an alignment of the plurality of PCB edge pads when inserted or removed from the associated backplane, and to assist in maintaining the I/O module insertion timing sequence and I/O module removal timing sequence.

10. The control module for an industrial device according to claim 9, wherein the insertion and removal guide includes a pivot connection of the I/O module to the associated backplane, and the I/O module is inserted and removed from the associated backplane with a rotating motion of the I/O module.

11. A point-to-point backplane for an industrial control device comprising:
a plurality of mounting bases configured to removably couple a plurality of respective I/O (Input/Output) modules, each mounting base including a passive bypass data switch operatively associated with a respective I/O module which an insertion and removal of the I/O module from the mounting base mechanically opens and closes, respectively, the passive bypass data switch, the passive bypass data switch including a first switch contact operatively associated with a first data communication channel which also terminates at a first data communication contact for connection to an I/O module first communication channel PCB edge pad and a second switch contact operatively associated with the second data communication channel which also terminates at a second data communication contact for connection to an I/O module second communication channel PCB edge pad, wherein the passive bypass data switch is a make-before-break double contact connector adapted to accept PCB edge pads operatively connected to a control module.

12. A point-to-point backplane for an industrial control device comprising:
a plurality of mounting bases configured to removably couple a plurality of respective I/O (Input/Output) modules, each mounting base including a passive bypass data switch operatively associated with a respective I/O module which an insertion and removal of the I/O module from the mounting base mechanically opens and closes, respectively, the passive bypass data switch, the passive bypass data switch including a first switch contact operatively associated with a first data communication channel which also terminates at a first data communication contact for connection to an I/O module first communication channel PCB edge pad and a second switch contact operatively associated with the second data communication channel which also terminates at a second data communication contact for connection to an I/O module second communication channel PCB edge pad, wherein the I/O module first communication channel PCB edge pads are located on a first side of the PCB and the second communication channel PCB edge pads are located on an opposite second side of an I/O module PCB, and the first communication channel PCB edge pads and second communication channel PCB edge pads are of equivalent length and aligned parallel to each other.

13. The point-to-point backplane for an industrial control device according to claim 12, wherein the I/O module first communication channel PCB edge pads are located on a first side of the PCB and the second communication channel PCB edge pads are located on an opposite second side of the PCB, the first communication channel PCB edge pads and second communication channel PCB edge pads are of equivalent length and aligned parallel to each other, and the normally closed passive make-before-break bypass data switch is a normally closed double contact switch with a top set of contacts and a bottom set of normally closed contacts to function as a make-before-break bypass data switch as the first communication channel PCB edge pads and the second communication channel PCB edge pads are inserted into the normally closed double contact switch.

14. A point-to-point backplane for an industrial control device comprising:

a plurality of mounting bases configured to removably couple a plurality of respective I/O (Input/Output) modules, each mounting base including a passive bypass data switch operatively associated with a respective I/O module which an insertion and removal of the I/O module from the mounting base mechanically opens and closes, respectively, the passive bypass data switch, the passive bypass data switch including a first switch contact operatively associated with a first data communication channel which also terminates at a first data communication contact for connection to an I/O module first communication channel PCB edge pad and a second switch contact operatively associated with the second data communication channel which also terminates at a second data communication contact for connection to an I/O module second communication channel PCB edge pad, wherein the I/O module includes a RIUP control signal PCB edge pad located on a first side of the PCB and a second edge pad located on an opposite second side of the PCB, and the first RIUP control signal PCB edge pads are of equivalent length and aligned parallel to each other, and the mounting base includes a single contact terminal to provide a loopback signal to the I/O module after the RIUP control signal PCB edge pads are inserted into the single contact terminal.

15. A point-to-point backplane for an industrial control device comprising:

a plurality of mounting bases configured to removably couple a plurality of respective I/O (Input/Output) modules, each mounting base including a passive bypass data switch operatively associated with a respective I/O module which an insertion and removal of the I/O module from the mounting base mechanically opens and closes, respectively, the passive bypass data switch, the passive bypass data switch including a first switch contact operatively associated with a first data communication channel which also terminates at a first data communication contact for connection to an I/O module first communication channel PCB edge pad and a second switch contact operatively associated with the second data communication channel which also terminates at a second data communication contact for connection to an I/O module second communication channel PCB edge pad, wherein the I/O module and backplane includes a power and chassis ground interface.

16. The point-to-point backplane for an industrial control device according to claim 15, wherein the power and ground interface includes a plurality of respective printed circuit board (PCB) edge pads located near a PCB interface connection edge, and the plurality of respective printed circuit board (PCB) edge pads are offset from the PCB interface connection edge a lesser distance relative a first data communication channel and a second data communication channel PCB edge pad offset from the PCB interface connection edge.

17. A point-to-point backplane for an industrial control device comprising:

a plurality of mounting bases configured to removably couple a plurality of respective I/O (Input/Output) modules, each mounting base including a passive bypass data switch operatively associated with a respective I/O module which an insertion and removal of the I/O module from the mounting base mechanically opens and closes, respectively, the passive bypass data switch, the passive bypass data switch including a first switch contact operatively associated with a first data communication channel which also terminates at a first data communication contact for connection to an I/O module first communication channel PCB edge pad and a second switch contact operatively associated with the second data communication channel which also terminates at a second data communication contact for connection to an I/O module second communication channel PCB edge pad, wherein the I/O module includes an insertion and removal guide which removably couples to the backplane to provide an alignment of the PCB edge pads when inserted or removed from the backplane, and to assist in maintaining the I/O module insertion timing sequence and I/O module removal timing sequence.

18. The industrial control device according to claim 17, wherein the insertion and removal guide includes a pivot connection of the I/O module to the backplane, and the I/O module is inserted and removed from the backplane with a rotating motion of the I/O module.

* * * * *